(12) United States Patent
Ohsawa et al.

(10) Patent No.: US 9,166,065 B2
(45) Date of Patent: Oct. 20, 2015

(54) MAGNETORESISTIVE EFFECT ELEMENT, MAGNETIC MEMORY, AND MAGNETORESISTIVE EFFECT ELEMENT MANUFACTURING METHOD

(75) Inventors: Yuichi Ohsawa, Yokohama (JP); Tadaomi Daibou, Yokohama (JP); Yushi Kato, Chofu (JP); Eiji Kitagawa, Yokohama (JP); Saori Kashiwada, Yokohama (JP); Minoru Amano, Sagamihara (JP); Junichi Ito, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 571 days.

(21) Appl. No.: 13/419,011

(22) Filed: Mar. 13, 2012

(65) Prior Publication Data

US 2013/0069182 A1   Mar. 21, 2013

(30) Foreign Application Priority Data

Sep. 21, 2011   (JP) .................................. 2011-206386

(51) Int. Cl.
| | |
|---|---|
| *H01L 29/82* | (2006.01) |
| *H01L 43/08* | (2006.01) |
| *H01L 43/10* | (2006.01) |
| *H01L 27/22* | (2006.01) |

(Continued)

(52) U.S. Cl.
CPC ................ *H01L 29/82* (2013.01); *B82Y 40/00* (2013.01); *H01F 10/126* (2013.01); *H01F 10/3286* (2013.01); *H01F 41/303* (2013.01); *H01L 27/228* (2013.01); *H01L 43/08* (2013.01); *H01L 43/10* (2013.01); *G11C 11/161* (2013.01)

(58) Field of Classification Search
CPC ...... H01L 43/08; G11C 11/16; H01F 10/3254
USPC ...................... 257/421, 422; 365/48, 158, 148
See application file for complete search history.

(56) References Cited

U.S. PATENT DOCUMENTS

| | | | |
|---|---|---|---|
| 6,713,830 B2 * | 3/2004 | Nishimura et al. | ........... 257/421 |
| 6,844,605 B2 * | 1/2005 | Nishimura | .................... 257/421 |

(Continued)

FOREIGN PATENT DOCUMENTS

| | | |
|---|---|---|
| JP | 2006-269866 | 10/2006 |
| JP | 2010-205931 | 9/2010 |

OTHER PUBLICATIONS

U.S. Appl. No. 13/210,678, filed Aug. 16, 2011, Tadaomi Daibou, et al.

(Continued)

*Primary Examiner* — Bradley K Smith
*Assistant Examiner* — David Goodwin
(74) *Attorney, Agent, or Firm* — Oblon, McClelland, Maier & Neustadt, L.L.P.

(57) ABSTRACT

According to one embodiment, a magnetoresistive effect element includes a first magnetic film having magnetic anisotropy and an invariable magnetization direction in a direction perpendicular to a film plane, a second magnetic film having magnetic anisotropy and a variable magnetization direction in the direction perpendicular to the film plane, and a nonmagnetic film between the first magnetic film and the second magnetic film. At least one of the first and second magnetic films includes a first magnetic layer. The first magnetic layer includes a rare earth metal, a transition metal, and boron.

13 Claims, 19 Drawing Sheets

(51) Int. Cl.
*H01F 10/12* (2006.01)
*H01F 10/32* (2006.01)
*H01F 41/30* (2006.01)
*B82Y 40/00* (2011.01)
*G11C 11/16* (2006.01)

(56) References Cited

U.S. PATENT DOCUMENTS

| | | | |
|---|---|---|---|
| 7,276,384 B2* | 10/2007 | Parkin et al. | 438/3 |
| 7,596,015 B2* | 9/2009 | Kitagawa et al. | 365/158 |
| 7,787,288 B2* | 8/2010 | Kitagawa et al. | 365/158 |
| 8,098,514 B2* | 1/2012 | Nagase et al. | 365/158 |
| 8,790,798 B2* | 7/2014 | Shukh | 428/811.1 |
| 2005/0110004 A1* | 5/2005 | Parkin et al. | 257/30 |
| 2005/0226043 A1* | 10/2005 | Parkin et al. | 365/173 |
| 2009/0080239 A1 | 3/2009 | Nagase et al. | |
| 2011/0310660 A1* | 12/2011 | Yamada et al. | 365/158 |
| 2012/0261777 A1* | 10/2012 | Shukh | 257/421 |

OTHER PUBLICATIONS

U.S. Appl. No. 13/234,720, filed Sep. 16, 2011, Eiji Kitagawa.
M. Kobayashi, et al., "Effects of Additive Elements on Corrosion Resistance of RE-TM Films", Journal of Magnetic Society Japan, vol. 9, No. 2, 1985, pp. 93-96.
Japanese Office Action issued Jun. 24, 2014, in Japan Patent Application No. 2011-206386 (with English translation).

* cited by examiner

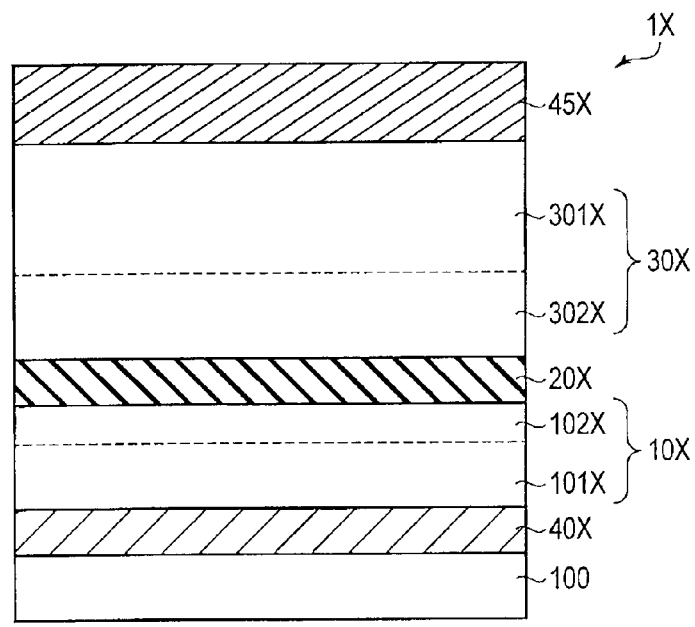
F I G. 3
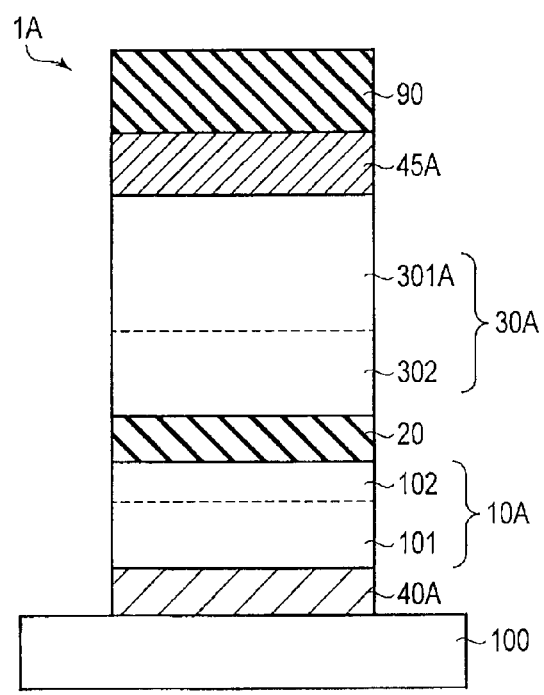
F I G. 4

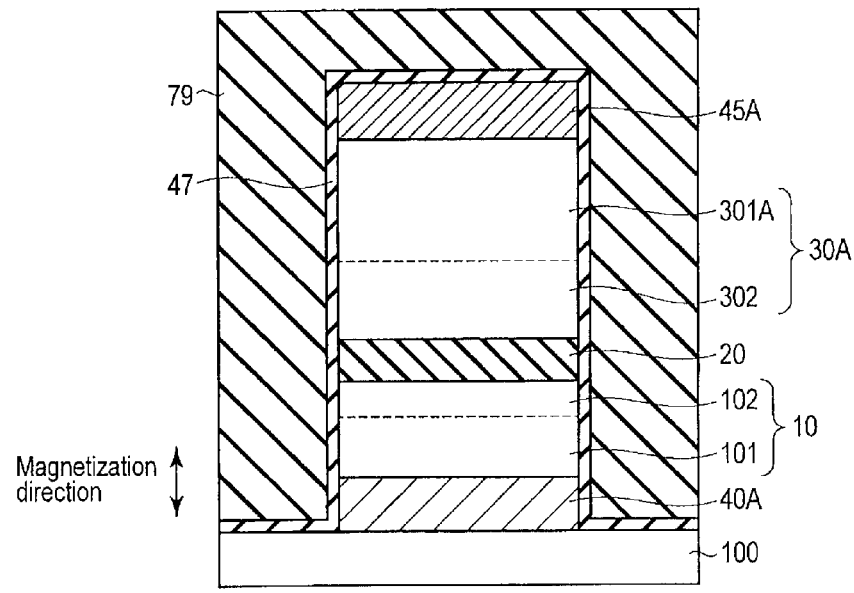
F I G. 5
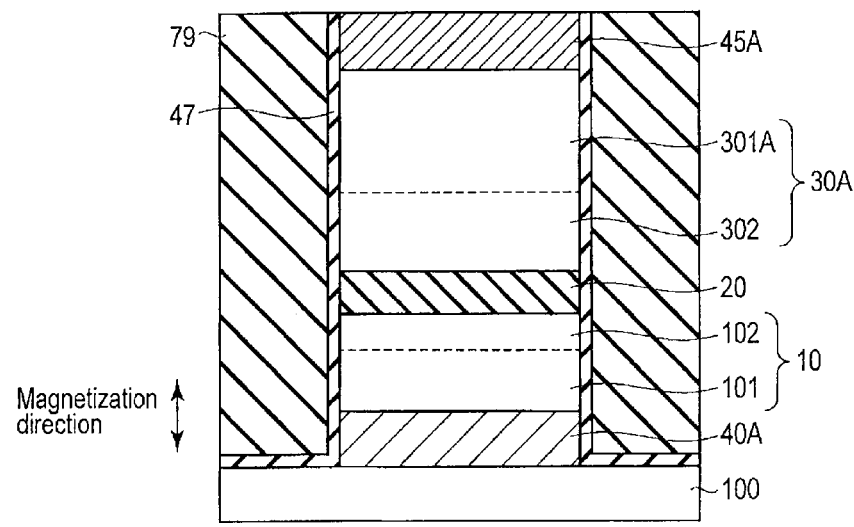
F I G. 6

| Sample | Tb[at.%] | Co[at.%] | Fe[at.%] | B[at.%] | Hc[kOe] |
|---|---|---|---|---|---|
| 1 | 44 | 18 | 38 | 0 | 4 |
| 2 | 44 | 18.5 | 37 | 0.5 | 4.5 |
| 3 | 44 | 18.5 | 36.5 | 1 | 5.5 |
| 4 | 44 | 18.5 | 35 | 2.5 | 6 |
| 5 | 44 | 18.5 | 32.5 | 5 | 7 |
| 6 | 44 | 18.5 | 27.5 | 10 | 8 |
| 7 | 44 | 18.5 | 17.5 | 20 | 8 |
| 8 | 44 | 18.5 | 12.5 | 25 | 3 |
| 9 | 40.5 | 22 | 27.5 | 10 | 7 |
| 10 | 37.5 | 25 | 27.5 | 10 | 6 |
| 11 | 50 | 12.5 | 27.5 | 10 | 8 |
| 12 | 54 | 8.5 | 27.5 | 10 | 6 |

F I G. 8

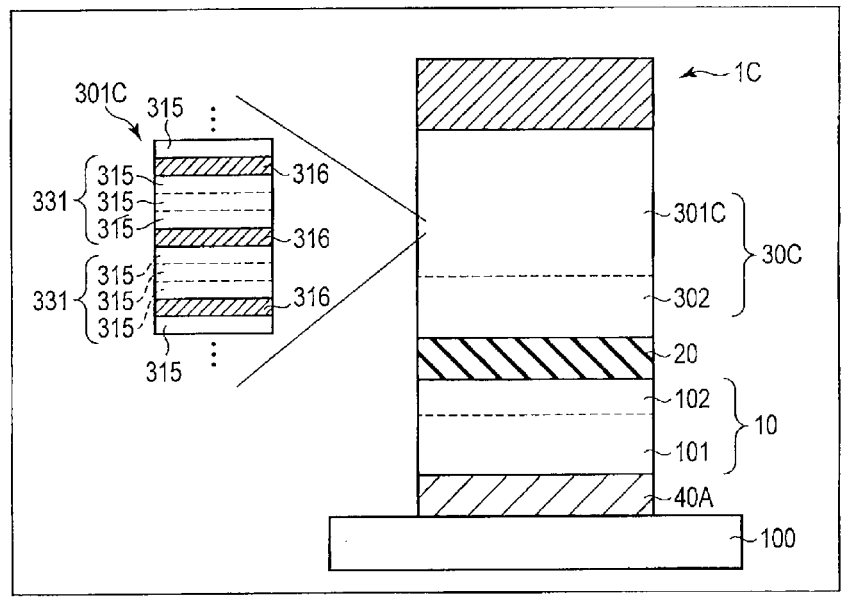
F I G. 9
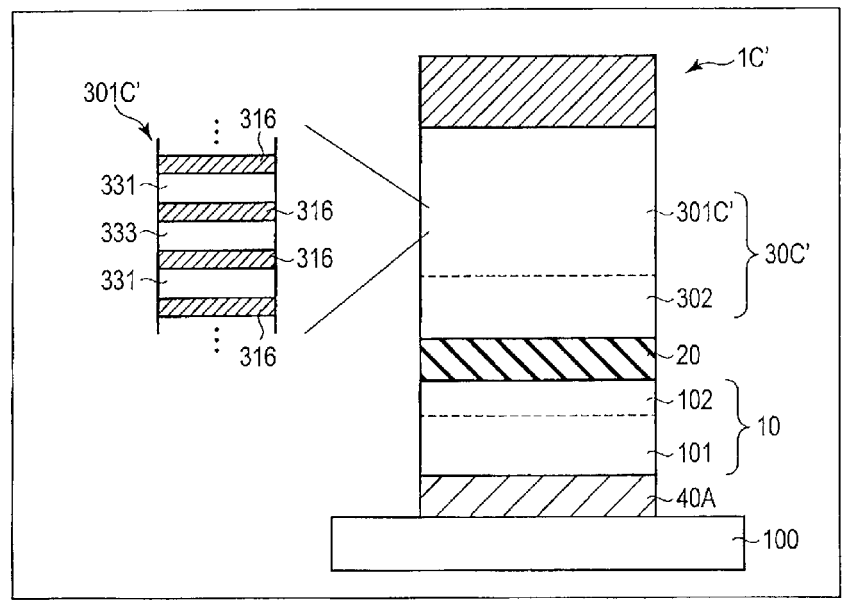
F I G. 10

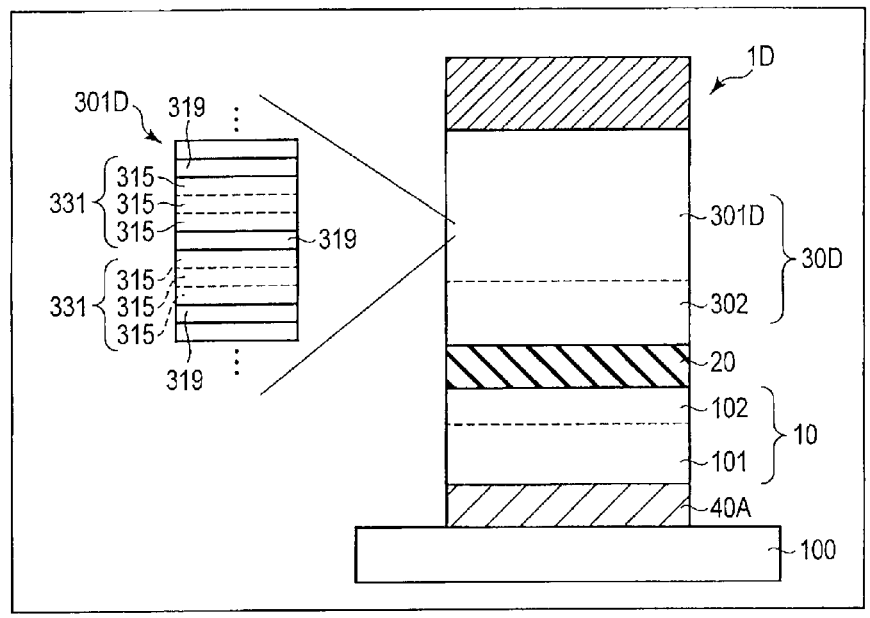
F I G. 11
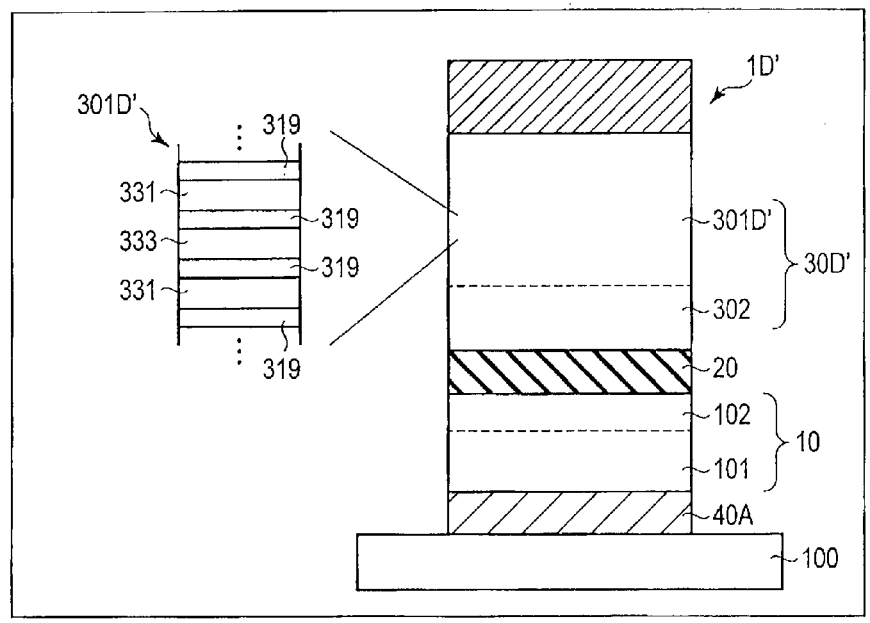
F I G. 12

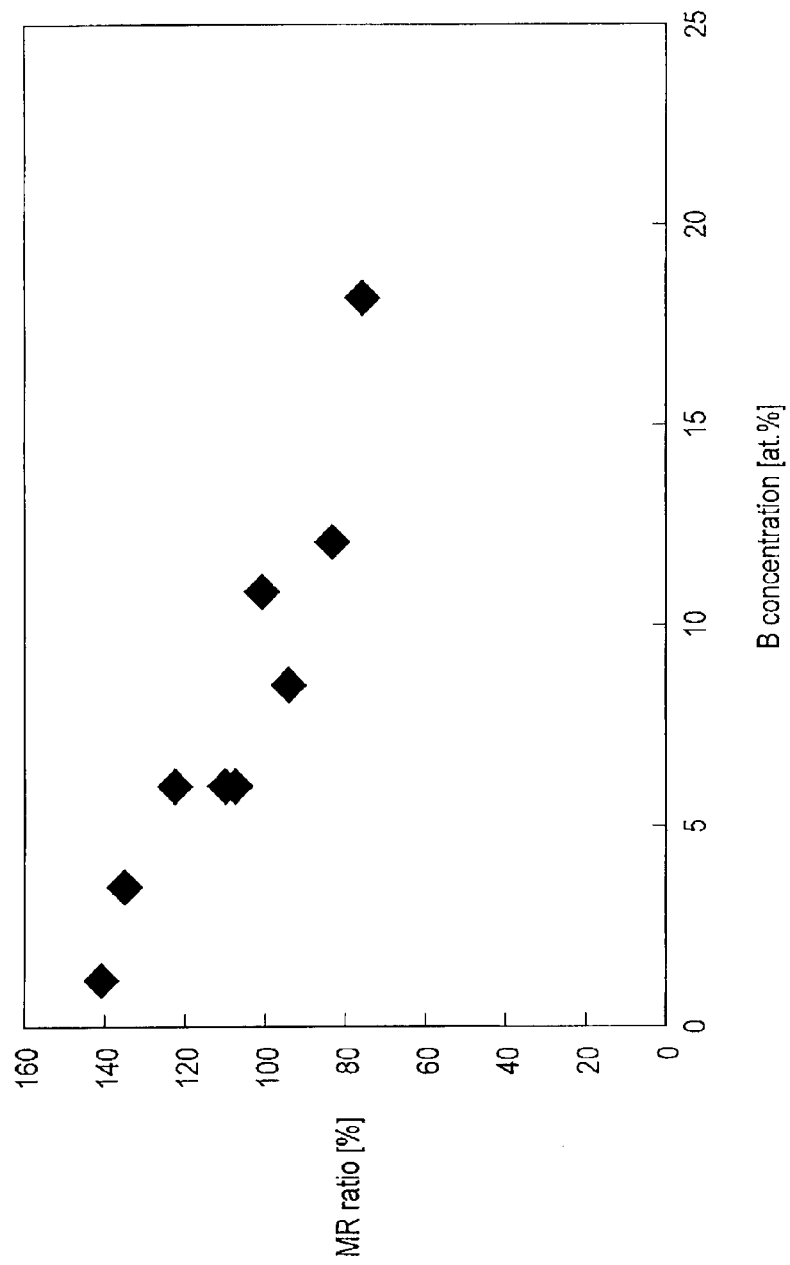
F I G. 17

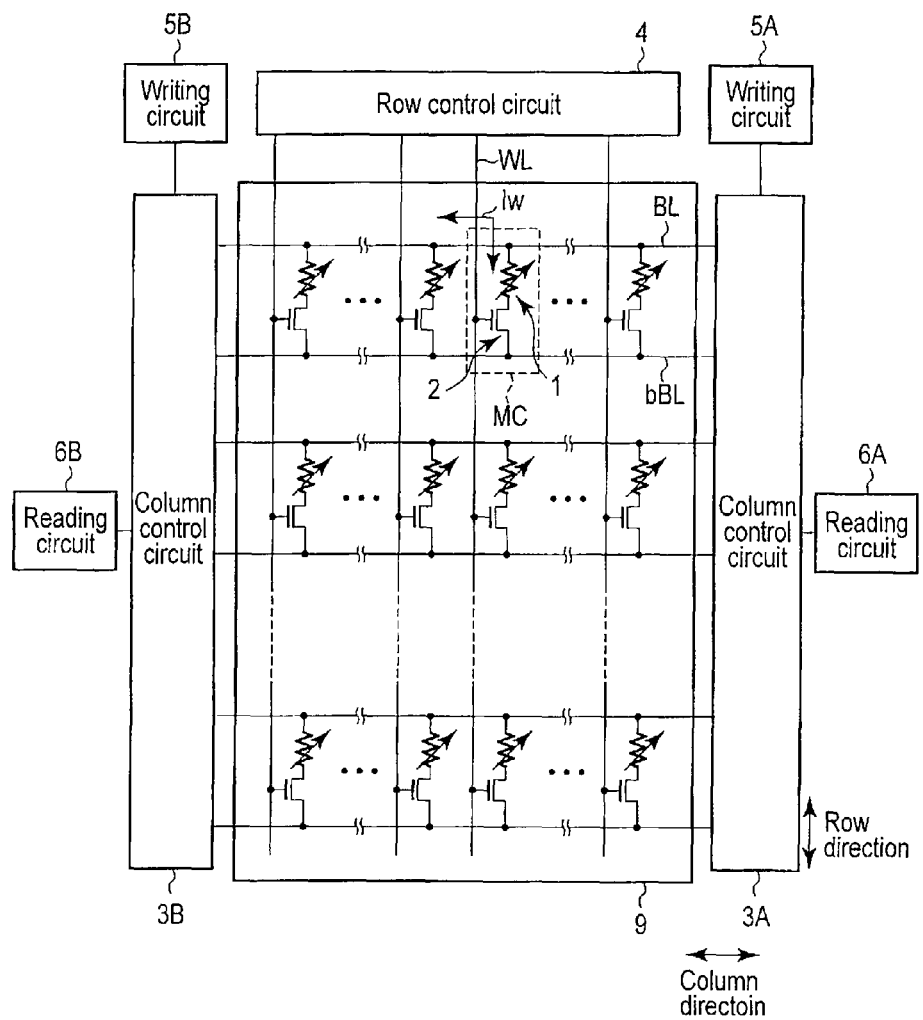
F I G. 25

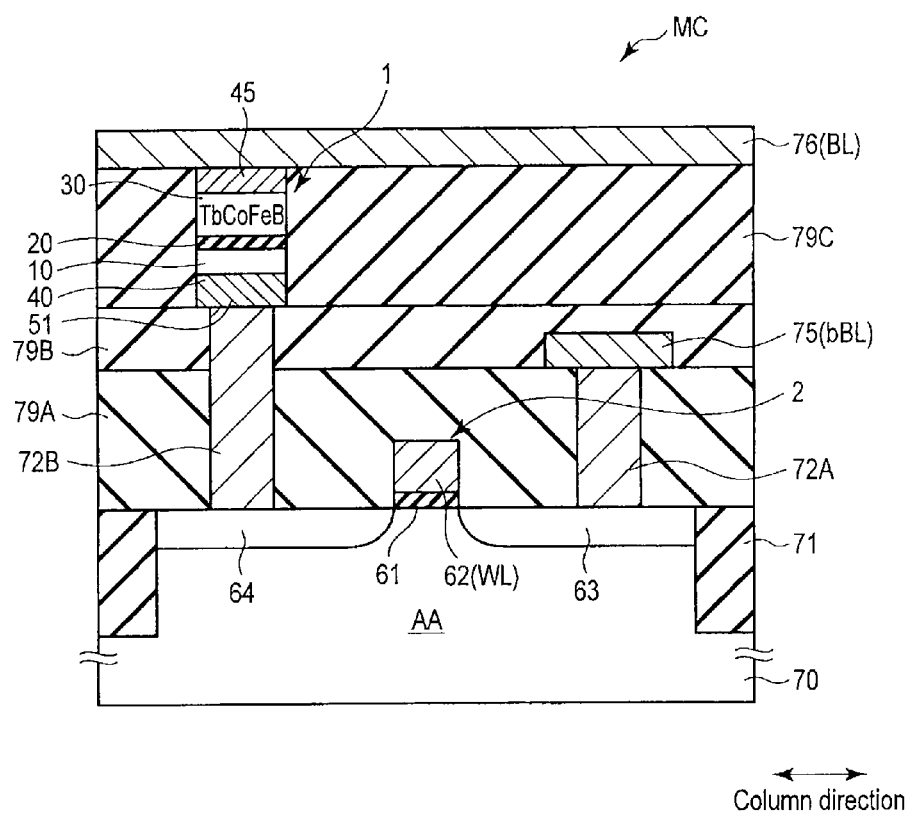
F I G. 26

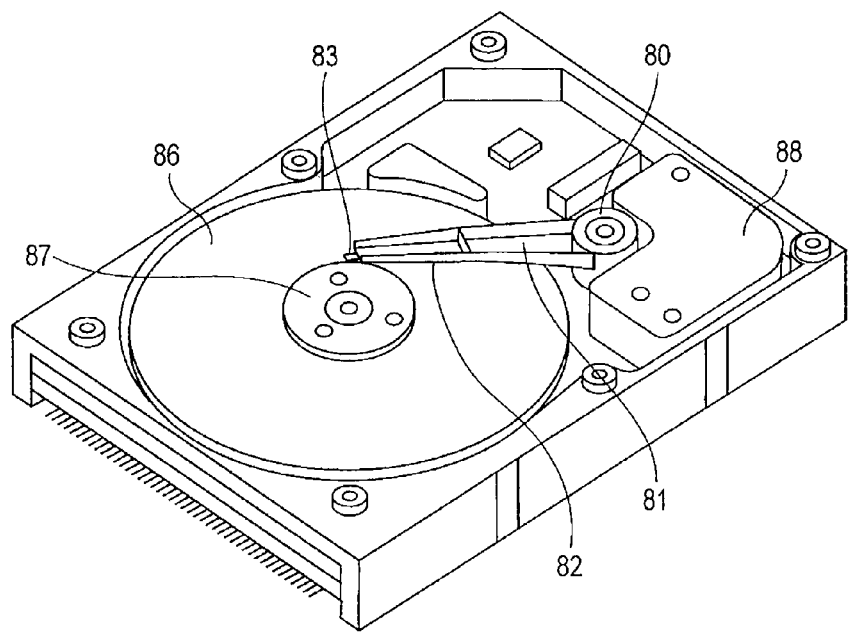
F I G. 29
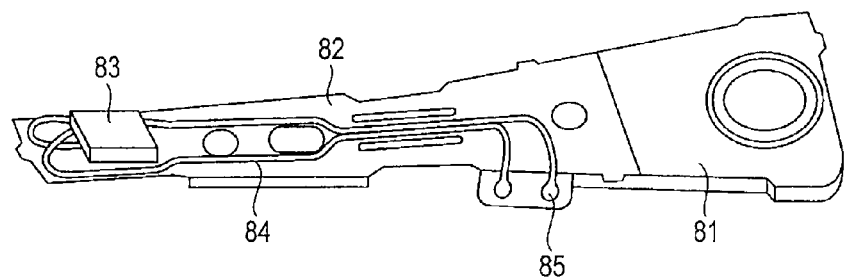
F I G. 30

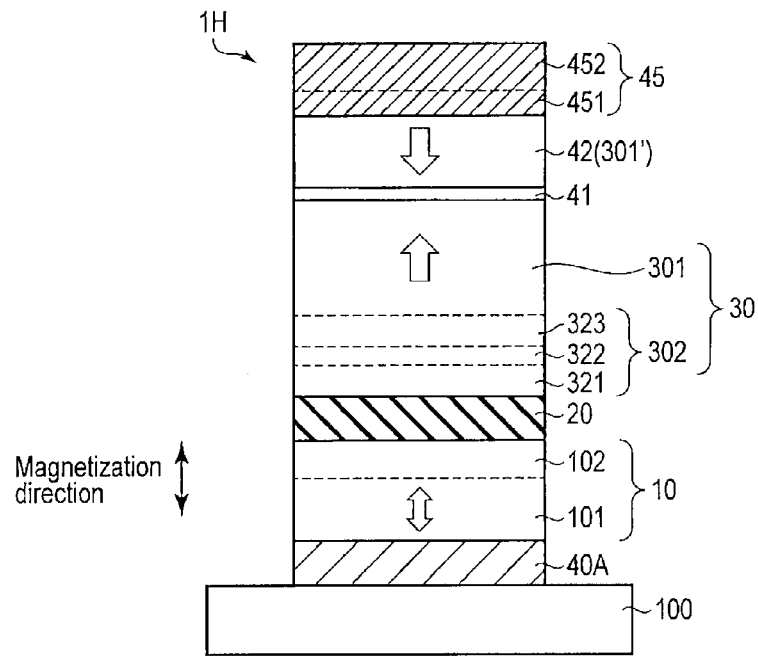
F I G. 31
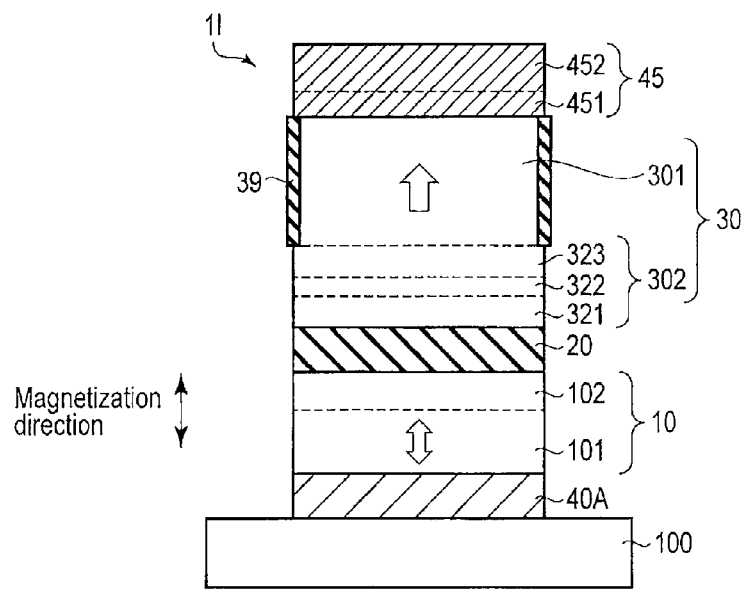
F I G. 32

US 9,166,065 B2

MAGNETORESISTIVE EFFECT ELEMENT, MAGNETIC MEMORY, AND MAGNETORESISTIVE EFFECT ELEMENT MANUFACTURING METHOD

CROSS-REFERENCE TO RELATED APPLICATIONS

This application is based upon and claims the benefit of priority from prior Japanese Patent Application No. 2011-206386, filed Sep. 21, 2011, the entire contents of which are incorporated herein by reference.

FIELD

Embodiments described herein relate generally to a magnetoresistive effect element, a magnetic memory, and a magnetoresistive effect element manufacturing method.

BACKGROUND

Memory devices that use magnetism, such as a hard disk drive (HDD) and a magnetoresistive random access memory, have been developed. In order to increase the storage density of the memory, magnetic bodies used in the memory devices have been miniaturized. Due to the miniaturization of the magnetic bodies, a magnetic field used for the operation of the memory needs to be applied to the micro magnetic body. However, as the magnetic field has the property of spreading in space, it is difficult to locally generate the magnetic field. If a magnetic field generating source is reduced in size to form a local magnetic field, it may be impossible to form a sufficient size of a magnetic field to control the magnetization direction of the magnetic body.

One technique is known to solve this problem in the MRAM. "Spin transfer switching" that passes a current through a magnetic body to switch the magnetization direction of the magnetic body is studied as one method of writing data in the MRAM. According to this spin transfer switching, a write current is passed through a magnetoresistive effect element, and spin-polarized electrons generated therein are used to switch the magnetization direction of a magnetic body (magnetic layer) in the magnetoresistive effect element.

The use of this spin transfer switching allows a magnetization condition in a nano-scale magnetic body to be easily controlled by the local magnetic field and also allows the value of the current for switching the magnetization to be reduced in accordance with the magnetization of the magnetic bodies.

Recently, studies have been carried out to use, for a reference layer and a storage layer of the magnetoresistive effect element of the MRAM, a perpendicular magnetization film having its magnetization direction in a direction perpendicular to a film plane.

BRIEF DESCRIPTION OF THE DRAWINGS

FIG. 3 to FIG. 6 are sectional process views showing an example of a method of manufacturing the magnetoresistive effect element according to the first embodiment;

FIG. 8 is a table showing the relation between the composition ratio and magnetic characteristics in a magnetic layer;

FIG. 9 to FIG. 12 are sectional views showing a structural example of a magnetoresistive effect element according to a second embodiment;

FIG. 17 is a graph illustrating the magnetoresistive effect element according to the second embodiment;

FIG. 25 to FIG. 30 are views showing applications of the magnetoresistive effect element according to the embodiments; and FIG. 31 and FIG. 32 are views showing a modification of the magnetoresistive effect element according to the embodiments.

DETAILED DESCRIPTION

Embodiments

Hereinafter, embodiments will be described in detail with reference to the drawings. The same signs are assigned to components having the same function and configuration in the following explanation, and repeated explanations are given when necessary.

In general, according to one embodiment, a first magnetic film having magnetic anisotropy and an invariable magnetization direction in a direction perpendicular to a film plane; a second magnetic film having magnetic anisotropy and a variable magnetization direction in the direction perpendicular to the film plane; and a nonmagnetic film between the first magnetic film and the second magnetic film. At least one of the first and second magnetic films includes a first magnetic layer. The first magnetic layer includes a rare earth metal, a transition metal, and boron.

[0] Basic Form

A magnetoresistive effect element according to an embodiment is described with reference to FIG. 1.

Figure 1:
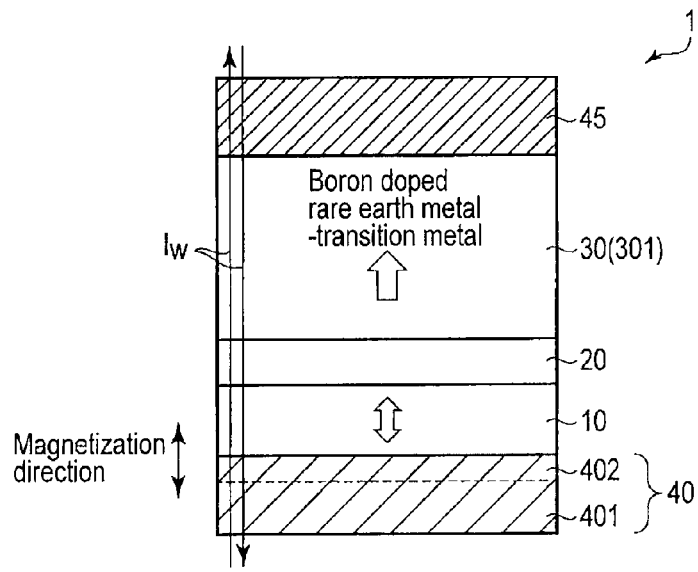
FIG. 1 is a sectional view illustrating the structure of a magnetoresistive effect element in a basic form.

FIG. 1 is a schematic sectional view illustrating the basic structure of the magnetoresistive effect element according to the embodiment. A magnetoresistive effect element 1 according to the embodiment has a stack structure including a foundation layer 40 that includes a lower electrode, first and second magnetic films (magnetic bodies or magnetic layers) 10 and 30, a nonmagnetic film (nonmagnetic body or nonmagnetic layer) 20, and an upper electrode 45.

As shown in FIG. 1, in the magnetoresistive effect element 1 according to the embodiment, the foundation layer 40 is provided on a substrate (not shown). The first magnetic film 10 is stacked on the foundation layer 40. The nonmagnetic film 20 is stacked on the first magnetic film 10. The second magnetic film 30 is stacked on the nonmagnetic film 20. The upper electrode 45 is stacked on the second magnetic film 30.

In the magnetoresistive effect element 1 according to the embodiment (basic form), the magnetization direction of one of the first and second magnetic films 10 and 30 is set to be variable, and the magnetization direction of the other magnetic film is set to be invariable. In the embodiment, the magnetization direction of the first magnetic film 10 is variable. The magnetization direction of the second magnetic film 30 is invariable. In the embodiment, the magnetic film (magnetic body, magnetic layer) which is variable in magnetization direction is referred to as a storage layer (magnetization free layer, free layer, or recording layer), and the magnetic film (magnetic layer) which is invariable in magnetization direction is referred to as a reference layer (magnetization invariable layer or fixed layer).

The magnetoresistive effect element 1 according to the embodiment switches the relative magnetization directions of the storage layer 10 and the reference layer 30 in accordance with, for example, the spin transfer switching. In accordance with the spin transfer switching, the magnetization arrangements of the first magnetic film 10 and the second magnetic film 30 in the magnetoresistive effect element 1 are changed by passing a current Iw through the magnetoresistive effect element 1.

Spin-polarized electrons are generated when the current Iw is passed in a direction perpendicular to the film plane of the magnetic layers (magnetic films) of the magnetoresistive effect element 1 (film stacking direction). The angular momentum of the generated spin-polarized electrons is transmitted to electrons in the storage layer 10 so that the magnetization (spin) direction of the storage layer 10 is switched. The magnetization direction of the storage layer 10 changes with the direction of the current Iw passed through the magnetoresistive effect element 1.

In contrast, the magnetization direction of the reference layer 30 is invariable (fixed) even if the current Iw is supplied thereto.

Here, that "the magnetization direction of the reference layer 30 is invariable" or "the magnetization direction of the reference layer 30 is fixed" means that the magnetization direction of the reference layer 30 does not change when the current (switching threshold current) Iw equal to or more than a magnetization switching threshold for switching the magnetization direction of the storage layer 10 is passed through the reference layer 30. Therefore, in the magnetoresistive effect element 1, a magnetic layer having a high switching threshold is used as the reference layer 30, and a magnetic layer having a switching threshold lower than that of the reference layer 30 is used as the storage layer 10. As a result, the magnetoresistive effect element 1 including the storage layer 10 variable in magnetization direction and the reference layer 30 invariable in magnetization direction is formed.

When the magnetization of the magnetic film (storage layer) 10 is switched by the spin-polarized electrons, the magnetization switching current (switching threshold current) Iw of the magnetic film is proportional to the damping constant, anisotropic magnetic field, and volume of the magnetic film. Therefore, the physical property value of the magnetic film can be properly adjusted to make a difference between the magnetization switching threshold of the storage layer 10 and the magnetization switching threshold of the reference layer 30.

In accordance with the spin transfer switching, in order for the magnetization direction of the storage layer 10 to be parallel to the magnetization direction of the reference layer 30, that is, in order for the magnetization direction of the storage layer 10 to be the same as the magnetization direction of the reference layer 30, a current running from the storage layer 10 to the reference layer 30 is supplied to the magnetoresistive effect element 1. In this case, electrons move from the reference layer 30 to the storage layer 10 via the nonmagnetic layer (nonmagnetic film) 20. The majority (spin-polarized electrons) of electrons which have passed through the reference layer 30 and the nonmagnetic layer 20 have spin of the same direction as the magnetization (spin) direction of the reference layer 30. The spin angular momentum (spin torque) of the spin-polarized electrons is applied to the magnetization of the storage layer 10, and the magnetization direction of the storage layer 10 is switched to the same direction as the magnetization direction of the reference layer 30. In the parallel arrangement, the resistance value of the magnetoresistive effect element 1 is lowest.

In accordance with the spin transfer switching, in order for the magnetization direction of the storage layer 10 to be antiparallel to the magnetization direction of the reference layer 30, that is, in order for the magnetization direction of the storage layer 10 to be opposite to the magnetization direction of the reference layer 30, a current running from the reference layer 30 to the storage layer 10 is supplied to the magnetoresistive effect element 1. In this case, electrons move from the storage layer 10 to the reference layer 30. The electrons having a spin antiparallel to the magnetization direction of the reference layer 30 are reflected by the reference layer 30. The reflected electrons are injected into the storage layer 10 as spin-polarized electrons. The spin angular momentum of the spin-polarized electrons (reflected electrons) is applied to the magnetization of the storage layer 10, and the magnetization direction of the storage layer 10 becomes opposite to the magnetization direction of the reference layer 30. In the antiparallel arrangement, the resistance value of the magnetoresistive effect element 1 is highest.

The magnetoresistive effect element 1 according to the embodiment is a magnetic tunnel junction (MTJ) element that utilizes the change of magnetic resistance caused by a spin-polarized tunneling effect. Hereinafter, the magnetoresistive effect element is referred to as an MTJ element 1.

The storage layer 10 and the reference layer 30 each have magnetic anisotropy in a direction perpendicular to the film plane.

The easy magnetization direction of the storage layer 10 and the reference layer 30 is perpendicular to the film plane (or a stack plane). That is, the MTJ element 1 according to the embodiment is a perpendicular magnetization type magnetoresistive effect element in which the magnetizations of the storage layer 10 and the reference layer 30 are perpendicular to the film plane. Hereinafter, a magnetic film (magnetic layer, magnetic body) having magnetic anisotropy in a direction perpendicular to the film plane is also referred to as a perpendicular magnetization film.

The easy magnetization direction is a magnetization direction in which when a macro-size ferromagnetic body is assumed, the spontaneous magnetization of the magnetic body has the lowest internal energy in a condition free of an external magnetic field. In contrast, a hard magnetization direction is a direction in which when a macro-size ferromagnetic body is assumed, the spontaneous magnetization of the magnetic body has the highest internal energy in a condition free of an external magnetic field.

Hereinafter, a multilayer structure (or stack structure) having a component A and a component B is represented by "A/B". This shows that the component "A" on the left side of "/" is stacked on the component "B" on the right side of "/".

The above-mentioned foundation layer 40 includes a thick metal layer 401 as the lower electrode, and a metal layer 402 as a buffer layer for growing a perpendicular magnetization magnetic layer (perpendicular magnetization film) into a planar form. A stack structure including at least one of metal layers made of, for example, tantalum (Ta), copper (Cu), ruthenium (Ru), and iridium (Ir) is illustrated as the foundation layer 40.

For example, the lower electrode 401 in the foundation layer 40 has a multilayer structure including Ta/Cu/Ta. The upper surface (surface contacting the magnetic film 10) of the buffer layer 402 in the foundation layer 40 preferably has an atom dense surface depending on the material used for the magnetic film 10. Accordingly, the magnetic film (here, storage layer) 10 having high perpendicular magnetic anisotropy) is formed on the foundation layer 40. For example, the buffer layer 402 has a multilayer structure including Pd/Ir/Ru. The Ru film has a crystalline orientation, for example, in an hcp (0001) face (c-axis direction) to control the crystalline orientation of the Ir film and the Pd film. The Ir film and the Pd film have the effects of improving the perpendicular magnetic anisotropy of the storage layer 10. The degree of the perpendicular magnetic anisotropy of the storage layer 10 can be changed by adjusting the thickness of the Ir film and the Pd film. The Pd film of the foundation layer 40 may be regarded as a part of the storage layer 10. The buffer layer 402 does not need to include the Pd film.

The foundation layer 40 for crystalline orientation may include one conductive layer doubling as the lower electrode 401 and a leader line. The foundation layer (buffer layer) 402 and the lower electrode 401 may be formed in different layers. The buffer layer 402 and the lower electrode 401 may be formed from one layer, and a leader line may be separately provided.

The storage layer 10 is provided on the foundation layer 40. As the material of the storage layer 10 provided on the foundation layer 40, a ferromagnetic material, a soft magnetic material, or artificial lattice is used. As the ferromagnetic material, a magnetic material having an $L1_0$ structure or an $L1_1$ structure is used. More specifically, for example, iron-palladium (FePd), iron-platinum (FePt), cobalt-palladium (CoPd), or cobalt-platinum (CoPt) is used. As the soft magnetic material, for example, cobalt-iron-boron (CoFeB) is used. The artificial lattice includes, for example, a stack structure including a magnetic material such as NiFe, Fe, or Co and nonmagnetic material such as Cu, Pd, Pt. A ferrimagnetic material may be used for the storage layer 10.

The nonmagnetic layer 20 is, for example, a magnesium oxide (MgO) film. The nonmagnetic layer 20 for which an insulating film such as an MgO film is used is referred to as a tunnel barrier layer. The nonmagnetic layer is hereinafter referred to as a tunnel barrier layer 20. The MgO film as the tunnel barrier layer 20 has, for example, a thickness of 10 angstroms (1 nm). For example, calcium oxide (CaO), strontium oxide (SrO), titanium oxide (TiO), vanadium oxide (VO), niobium oxide (NbO), and aluminum oxide ($Al_2O_3$) may be used for the nonmagnetic layer. Mg nitride or Al nitride may be also used for the nonmagnetic layer. Not only a single layer film of these oxides and nitrides but also stacked films of these insulators may be used for the nonmagnetic layer 20. MgO has a crystal structure of a sodium chloride (NaCl) structure. When a material such as MgO having the NaCl structure is used as the nonmagnetic layer (tunnel barrier layer) 20, it is preferable that the MgO film as the nonmagnetic layer 20 has a crystalline orientation, for example, is preferentially orientated to a bcc (001) face (or orientation) and a face (or orientation) equivalent thereto.

The reference layer 30 is provided on the tunnel barrier layer 20. The tunnel barrier layer 20 is provided between the storage layer 10 and the reference layer 30.

The upper electrode 45 is provided on the reference layer 30. For example, the upper electrode 45 functions as the electrode of the MTJ element 1 and also functions as a hard mask for processing the MTJ element 1. As the material of the upper electrode (hard mask layer) 45, a metal such as tantalum (Ta) or tungsten (W), or a conductive compound such as titanium nitride (TiN), titanium silicon nitride (TiSiN), or tantalum silicon nitride (TaSiN) is used.

For example, in the MTJ element 1 according to the embodiment, the reference layer 30 is larger in thickness than the storage layer 10 so that the coercive force Hc of the reference layer 30 is higher. Therefore, the distribution of a magnetic field generated from the reference layer 30 is increased, and the magnetic field leaking from the reference layer 30 (magnetostatic stray field, leak magnetic field) is nonuniformly applied to the storage layer 10. The magnetic field leaking from the reference layer 30 and applied to the storage layer 10 acts in a direction that causes the magnetization direction of the storage layer 10 to be parallel to the magnetization direction of the reference layer 30. The magnetic field leaking from the reference layer 30 and applied to the storage layer 10 changes the magnetization switching magnetic field of the storage layer 10 and deteriorates the thermal disturbance resistance of the storage layer 10. The coercive force Hc of the storage layer 10 shifts due to the magnetic field leaking from the reference layer 30, and the thermal stability of the reference layer 30 and the storage layer 10 may change depending on whether the magnetization directions of the reference layer 30 and the storage layer 10 are parallel or antiparallel to each other. As the operation of the MTJ element 1 may thus be unstable due to the magnetic field leaking from the reference layer 30, the saturation magnetization Ms of the reference layer 30 is preferably low.

In a magnetic layer that uses a rare earth metal-transition metal (hereinafter referred to as a rare earth metal-transition metal magnetic layer or a ferrimagnetic layer), the magnetization direction of the rare earth metal is opposite to the magnetization direction of the transition metal. Therefore, the rare earth metal-transition metal magnetic layer has low saturation magnetization Ms and a high anisotropic magnetic field. For example, the rare earth metal-transition metal magnetic layer is preferably used for a magnetic layer of an ultramicro (nano-scale) magnetoresistive effect element (MTJ element) having a diameter of 40 nm or less in a direction parallel (level) with the substrate surface, in particular, for the reference layer 30.

For example, in the reference layer 30 of the MTJ element 1 according to the embodiment, a magnetic layer including terbium (Tb) (hereinafter referred to as a Tb-based magnetic layer) is used for the rare earth metal-transition metal magnetic layer (ferrimagnetic layer). However, gadolinium (Gd) or dysprosium (Dy) may be used instead of Tb. A part of Tb in the reference layer 30 may be substituted for Gd or Dy.

The reference layer 30 that uses the Tb-based magnetic layer in the magnetoresistive effect element 1 according to the embodiment is described below.

In the rare earth metal-transition metal magnetic layer, the Tb-based magnetic layer includes both or at least one of cobalt (Co) and iron (Fe) as a transition metal. The Tb-based magnetic layer, when including both Co and Fe, is represented as a TbCoFe layer.

A rare earth metal-transition metal magnetic layer (e.g., TbCoFe layer) 301 in the reference layer 30 of the MTJ element 1 according to the embodiment includes, boron (B).

The TbCoFe layer 301 containing B (hereinafter also referred to as a TbCoFeB layer) 301 is a perpendicular magnetization film having magnetic anisotropy perpendicular to the film plane.

When a rare earth element in the magnetic layer including the rare earth metal contacts oxygen outside the magnetic layer, the oxide of the rare earth metal tends to be formed on the surface of the magnetic layer. Therefore, the magnetic layer including the rare earth metal may have the problem in regard to its corrosion resistance (oxidation resistance).

For example, after the MTJ element is processed (patterned) into a predetermined shape, the MTJ element may be exposed to an atmosphere containing oxygen (e.g., air) before insulating films such as a protective film and an interlayer insulating film are formed in a vacuum to cover the MTJ element.

In this case, the magnetic layer including the rare earth metal is oxidized, and the magnetic characteristics, for example, coercive force Hc of the magnetic layer may be reduced. As a result, the characteristics of the MTJ element may deteriorate.

After the rare earth metal (e.g., Tb)-transition metal magnetic layer is exposed to the air, Tb oxide that is preferentially formed on the surface of the magnetic layer is seen if the surface of the magnetic layer is measured by X-ray photoelectron spectroscopy (XPS). The formation of the Tb oxide may deteriorate the magnetic characteristics of the magnetic layer (e.g., reference layer) included in the MTJ element and increase its saturation magnetization Ms.

If the MTJ element is exposed to the air after a layer that is reattached to the surface (processed surface) of the actually formed MTJ element by ion milling is removed, a decrease in the coercive force Hc of the rare earth metal-transition metal magnetic layer included in the MTJ element is observed.

Considerations are therefore needed in a manufacturing method. For example, the whole process from the formation of the element to the formation of the insulating films (the protective film and the interlayer insulating film) is conducted in a vacuum so that the element is not exposed to an atmosphere containing oxygen (e.g., air) after the formation of the element. However, these considerations may result in a rise in the manufacturing costs of an MTJ element and a device (e.g., MRAM) that includes the MTJ element.

In the XPS measurement of the rare earth metal-transition metal magnetic layer (TbFeCo layer) exposed to the atmosphere containing oxygen, a Tb oxide having a thickness of about 5 nm that is formed even in a significantly short time (e.g., several seconds) of exposure is observed if the depth distribution of the Tb oxide in the magnetic layer is measured by an XPS depth profile.

Thus, when a Tb oxide having a thickness of 5 nm is formed by the exposure to the air in an element such as a spin transfer switching MRAM in which uniform passage of a current is preferred, for example, in an element having a diameter of 50 nm during formation, the effective diameter of the element is 40 nm. That is, the effective area of the element in which the Tb oxide is formed is about 60% of the area in which no Tb oxide is formed.

In the MTJ element which has reached a diameter of 50 nm or less as a result of miniaturization, the inhibition of the formation of the Tb oxide in the Tb-based magnetic layer (rare earth metal-transition metal magnetic layer) is important.

The rare earth metal-transition metal magnetic layer (e.g., TbCoFe layer) of the MTJ element 1 according to the embodiment includes boron (B). B is an element that tends to be oxidizable (oxidized). In the Tb-based magnetic layer 301 to which B is added as the magnetic layer (e.g., reference layer) 30 of the MTJ element 1, B is oxidized together with Tb. As a result, in the B-doped Tb-based magnetic layer 301, B combines with oxygen in the vicinity of the surface layer of the magnetic layer, while a Tb component (Tb element) in lower layers (the inner side and the central side) is hardly oxidized and present in the magnetic layer (film) 30. Thus, the magnetization of the magnetic layer by Tb is maintained.

Oxygen is taken in by the oxidization of the B component in the B-doped Tb-based magnetic layer 301. The further oxidization of the magnetic layer is prevented by B, and the oxidization of the Tb component in the inner side is reduced. As a result, the corrosion resistance of the magnetic layer 301 is improved, and the deterioration of the magnetic characteristics of the magnetic layer 301 caused by the oxidization is inhibited. The addition of B does not deteriorate the magnetic characteristics of the rare earth metal-transition metal magnetic layer.

According to the embodiment, the B-doped rare earth metal-transition metal magnetic layer (e.g., TbCoFeB layer) enables the formation of a magnetic layer with improved corrosion resistance, low saturation magnetization Ms, and high coercive force Hc.

Although the boron (B)-doped rare earth metal-transition metal magnetic layer 301 is used for the reference layer 30 of the MTJ element 1 in the example shown according to the embodiment, the B-doped rare earth metal-transition metal magnetic layer 301 may be used for the storage layer 10 of the MTJ element 1.

As described above, the magnetoresistive effect element according to the embodiment allows the inhibition of element characteristic deterioration.

[1] First Embodiment (1) Configuration Example 1

Configuration example 1 of a magnetoresistive effect element according to the first embodiment is described with reference to FIG. 2 to FIG. 6.

(a) Structure

The structure of a magnetoresistive effect element (e.g., MTJ element) according to Configuration example 1 of the first embodiment is described with reference to FIG. 2.

Figure 2:
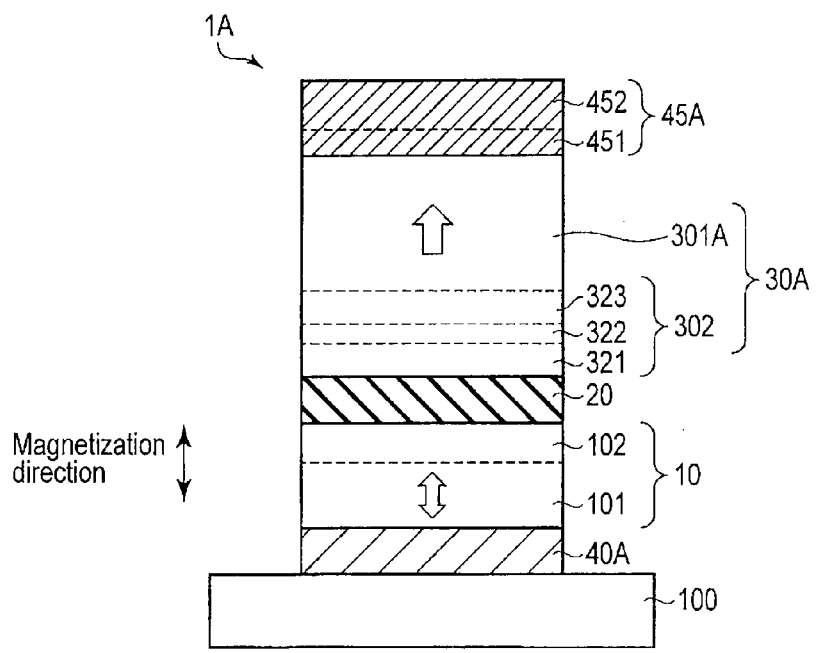
FIG. 2 is a sectional view showing a structural example of a magnetoresistive effect element according to a first embodiment.

FIG. 2 shows the sectional structure of an MTJ element 1A according to Configuration example 1 of the first embodiment. In FIG. 2, an insulating film over the MTJ element 1A is not shown.

In FIG. 2, the MTJ element 1A having a top-pin structure is shown. The top-pin magnetoresistive effect element has a structure including a storage layer 10 provided on the side of a substrate 100 for forming the magnetoresistive effect element, and a nonmagnetic layer (tunnel barrier layer) 20 and a reference layer 30A that are stacked on the storage layer 10. In contrast, a bottom-pin MTJ element has a structure including a reference layer provided on the side of a substrate 100 for forming the MTJ element, and a nonmagnetic layer and a storage layer that are stacked on the reference layer.

In the MTJ element 1A shown in FIG. 2, at least an uppermost layer of a foundation layer 40A as a lower electrode/buffer layer is, for example, a Ta film. Here, the foundation layer 40A is represented as a Ta film 40A. A material illustrated as the material of the above-mentioned lower electrode/buffer layer may be provided between the Ta film and the substrate 100. Another layer may be provided between the Ta film and the storage layer 10.

The storage layer 10 is provided on the Ta film 40A. The storage layer 10 includes artificial lattice 101. For example, the artificial lattice 101 has a stack structure (periodic structure) including cobalt (Co) and platinum (Pt). In the artificial lattice 101, one stack film (lattice) is formed of Co and Pt. Six periods of stack films (Pt/Co film) form the artificial lattice ($[Pt/Co]_6$ film). In the artificial lattice 101, for example, the Co film contacts the Ta film. The storage layer 10 is not limited to the artificial lattice, and may be any magnetic layer of a different material/structure having perpendicular magnetic anisotropy.

In the MTJ element 1A, parts (layers) of the magnetic layers (storage layer and reference layer) 10 and 30A located in the vicinity of the tunnel barrier layer 20 are referred to as interfacial layers. In the storage layer 10 of the MTJ element 1A according to Configuration example 1, an interfacial layer 102 is provided between the artificial lattice 101 and the tunnel barrier layer 20. The interfacial layer 102 on the side of the storage layer 10 is a CoFeB film. The interfacial layer 102 on the side of the storage layer 10 is not limited to the CoFeB film as long as the interfacial layer includes at least two elements (components) selected from the group consisting of Co, Fe, and B.

The artificial lattice 101 and the interfacial layer 102 have perpendicular magnetic anisotropy, and the magnetization direction of the artificial lattice 101 and the interfacial layer 102 is perpendicular to the film plane.

The tunnel barrier layer 20 is, for example, an MgO film. For example, it is preferable that the MgO film 20 as the tunnel barrier layer 20 is preferentially orientated to a (100) face (or a face equivalent thereto) to improve the characteristics (e.g., MR ratio) of the MTJ element 1A.

The reference layer 30A includes a TbCoFe layer 301 as a rare earth metal-transition metal magnetic layer. The TbCoFe layer is doped with boron (B) so that a TbCoFeB layer is formed.

In Configuration example 1, for example, a TbCoFeB layer 301A is an alloy layer. The TbCoFeB layer 301A may be a microcrystal layer (layer including micro-scale or nano-scale crystal), may be an amorphous layer, or may be a layer including both microcrystal and amorphous.

In the reference layer 30A, an interfacial layer 302 is provided in the vicinity of the tunnel barrier layer 20. The interfacial layer 302 intervenes between the TbCoFeB layer 301A and the tunnel barrier layer 20. The interfacial layer 302 in the reference layer 30A is, for example, a multilayer film. The interfacial layer 302 which is the multilayer film has a CoFeB/Ta/CoFeB structure. The TbCoFeB layer 301A and the interfacial layer 302 have perpendicular magnetic anisotropy, and the magnetization direction of the TbCoFeB layer 301A and the interfacial layer 302 is perpendicular to the film plane.

The interfacial layers 102 and 302 are provided in the storage layer 10 and the reference layer 30A such that the degree of the perpendicular magnetic anisotropy of the storage layer 10 and the reference layer 30A is improved. However, if the interfacial layer 102 in the storage layer 10 is increased in thickness, a magnetization switching current (magnetization switching threshold) resulting from spin injection into the storage layer 10 is increased. Therefore, the thickness of the interfacial layer 102 in the storage layer 10 is preferably 1.0 nm (10 angstroms) or less.

A material that lattice-matches the tunnel barrier layer 20 is preferably used for the interfacial layer 102 in the storage layer 10. This improves the crystallinity of the tunnel barrier layer 20, and improves the MR ratio of the MTJ element 1A. For example, when the tunnel barrier layer is the MgO film, a material that lattice-matches a bcc (001) face or a face equivalent thereto is preferably used for the interfacial layers 102 and 302 in the MgO film. The interfacial layer 302 in the reference layer 30A is preferably also made of a material that lattice-matches the tunnel barrier layer 20 to improve crystallinity.

In the interfacial layer 302 in the reference layer 30A, a Ta film 322 intervenes between two CoFeB films 321 and 323. The Ta film 322 inhibits a Tb component in the TbCoFe film 301 from diffusing in the vicinity of the tunnel barrier layer 20 or into the tunnel barrier layer 20 due to heat in the process of manufacturing the MTJ element 1A. This reduces the deterioration of the crystallinity of the tunnel barrier layer 20 caused by the diffusion of the Tb component, and inhibits the deterioration of the characteristics (e.g., MR ratio) of the MTJ element 1A.

When the TbCoFeB layer 302 is preferably an amorphous layer, the Ta film 322 in the interfacial layer 302 prevents crystal information in the MgO film from propagating to the amorphous TbCoFeB layer. This makes it possible to inhibit the amorphous TbCoFeB layer from being crystallized by the crystalline-orientated MgO film.

Instead of the Ta film 322 in the interfacial layer, one of a tungsten (W) film, niobium (Nb) film, and molybdenum (Mo) film may be inserted between the CoFeB films 321 and 323. A Ta film may be inserted in the interfacial layer 102 within the storage layer 10.

In the interfacial layer 302 within the reference layer 30A, the composition and thickness of the CoFeB film 323 on the side of the TbCoFeB layer may be different from the composition and thickness of the CoFeB film 321 on the side of the tunnel barrier layer.

The thickness of the interfacial layer 302 in the reference layer 30A is set at, for example, about 1 nm to 3 nm (10 angstroms to 30 angstroms).

An upper electrode 45A is provided on the B-doped TbCoFe layer 301A in the reference layer 30A. The upper electrode 45A is a stack film including an Ru film 451 and a Ta film 452. The Ru film 451 of the upper electrode 45A contacts the upper surface of the B-doped TbCoFe layer. The Ta film 452 is stacked on the Ru film 451. In the MTJ element 1A according to Configuration example 1, the reference layer 30A includes the B-doped TbCoFe layer 301A.

For example, in the TbCoFeB layer 301A, the composition ratio (average content, concentration) of Tb is set at 20 at. % (atomic percent) or more, and the sum of the composition ratios (average contents, concentrations) of Co and Fe is set at 30 at. % or more. When Co is only added to the rare earth metal-transition metal magnetic layer (when Fe is not included), the composition ratio of Co has only to be 30 at. % or more. On the contrary, when Fe is only added to the rare earth metal-transition metal magnetic layer (when Co is not included), the composition ratio of Fe has only to be 30 at. % or more. Moreover, when the composition ratios of Tb, Co, and Fe are set at the above-mentioned values in the TbCoFe film 301, the composition ratio (average content, concentration) of B is set at 1 at. % or more and 50 at. % or less.

Thus, the TbCoFe film 301 has perpendicular magnetic anisotropy, and can obtain low saturation magnetization Ms and high coercive force Hc. The composition ratio of each component in the TbCoFeB layer will be described later.

Here, in the present embodiment, the average content represents the concentration/composition ratio when each component is considered to be uniformly distributed in the magnetic layer. When the TbCoFeB layer is used in combination with the interfacial layer 302, the content is calculated without including the interfacial layer that include, for example, the CoFeB film in contact with the tunnel barrier layer of an insulator such as MgO. The composition in the magnetic layer is defined by finding the positions of the tunnel barrier layer and the interfacial layer through a cross-sectional transmission electron microscope (XTEM) with an electron beam diameter set at about 1 nm, and conducting a composition analysis using electron energy-loss spectroscopy (EELS). In this case, a region in which a rare earth material such as Tb is detected is a reference layer 301n (note that n=A, B, C . . . ). Five points in the thickness direction of the magnetic layer and five points in the radial direction (horizontal direction) of the magnetic layer are measured. The average value of these measurements is the average content in the magnetic layer (TbCoFeB layer). When the TbCoFeB layer described in the present embodiment is used as the storage layer, the composition ratio of the TbCoFeB layer as the storage layer is defined without including the interfacial layer. In this case, the ratio of the volume of the interfacial layer is found by the XTEM, and the amount of a signal from the interfacial layer is subtracted from the obtained EELS signal.

The specific composition ratio of each component in the B-doped TbCoFe layer (TbCoFeB layer) 301A of the MTJ element 1A according to Configuration example 1 is as follows.

In the TbCoFeB layer 301A of the MTJ element 1A according to Configuration example 1, for example, the composition of Tb is set at 35 at. %, the composition of Co is set at 15 at. %, the composition of Fe is set at 40 at. %, and the composition of B is set at 10 at. %. The thickness of the TbCoFeB layer 301A is set at 12 nm (120 angstroms).

During the formation of the MTJ element 1A including the TbCoFeB layer 301A having this composition ratio, the stack structure including the TbCoFeB layer 301A is processed into a predetermined element shape, and then the processed stack is exposed to an atmosphere containing oxygen (e.g., air), and an insulating film is further formed to cover the processed stack.

In the MTJ element 1A thus formed, the coercive force Hc of the reference layer 30A including the TbCoFeB layer 301A is about 8 kOe. In contrast, when B is not added to the TbCoFe layer, the coercive force Hc of the reference layer is about 4 kOe.

Boron (B) is thus added to the TbCoFeB layer 301A such that the coercive force Hc of the TbCoFeB layer 301A increases to about twice the coercive force Hc of the TbCoFe layer to which B is not added.

The TbCoFeB layer 301A as the rare earth metal-transition metal magnetic layer can thus maintain high coercive force Hc because the oxidation resistance of the TbCoFeB layer 301A is improved because the B component in the TbCoFeB layer 301A is preferentially oxidized and the B component inhibits the oxidization of the Tb component.

In a spin-torque transfer MRAM, a current of $10^{11}$ A/m$^2$ level density is used to write data into an MTJ element as a memory element. When the diameter of the MTJ element is 30 nm, the MTJ element is assumed to have an electric resistance that is more than 10 kΩ. Therefore, when the current having the above-mentioned density is passed through the MTJ element, heat of about 10 to 20 µW can be generated in the MTJ element. The inhibition of electromigration in the components of the MTJ element to which heat is applied in addition to an electric field is important as one way of improving the reliability of the MRAM and the MTJ element.

The application of a high-melting point material is effective as a means of inhibiting the electromigration. The melting point of boron (B) is about 2200° C. On the other hand, the melting point of terbium (Tb) is about 1350° C., and the melting point of cobalt (Co) and iron (Fe) is about 1500° C. Therefore, the heat resistance of the TbCoFe layer to which B as a high-melting point material is added can be improved as compared to that of the TbCoFe layer to which B is not added.

Thus, the addition of B to the TbCoFe film (rare earth metal-transition metal magnetic layer) is preferable to improve the corrosion resistance and as a measure against the electromigration generated in the MTJ element 1A.

As described above, the reference layer 30A is high in volume and high in magnetic field intensity. Therefore, the influence of oxidization on the magnetization distribution of the reference layer is also shown in the distribution of a magnetic field applied to the storage layer from the reference layer. Accordingly, the reliability of the characteristics and operation of the MTJ element are also influenced. Thus, in the magnetic layer (e.g., reference layer) included in the MTJ element which is miniaturized and has a diameter of 30 nm or less, adding B to the ferrimagnetic layer (rare earth metal-transition metal magnetic layer) to inhibit the oxidization of the magnetic layer and homogenize the magnetization of the magnetic layer as in the MTJ element according to the present embodiment is effective.

Similar effects can also be obtained when one or both of Dy and Gd is partly or totally substituted for Tb in the TbCoFeB layer 301A.

As described above, characteristic deterioration of magnetoresistive effect element 1A according to Configuration example 1 of the first embodiment can be inhibited.

(b) Manufacturing Method

A method of manufacturing the magnetoresistive effect element (e.g., MTJ element) according to Configuration example 1 of the first embodiment is described with reference to FIG. 3 to FIG. 6.

FIG. 3 to FIG. 6 are sectional process views each showing a step of manufacturing the magnetoresistive effect element (e.g., MTJ element) 1A according to the present embodiment.

As shown in FIG. 3, a foundation layer 40X including a lower electrode, a magnetic film 10X for forming a storage layer, a nonmagnetic layer 20X for forming a tunnel barrier layer, a magnetic layer 30X for forming a reference layer, and a conductive layer 45X for forming an upper electrode and a hard mask are stacked on a substrate 100 in order, for example, by a sputtering method.

The foundation layer 40X functions as a buffer layer for growing a planar perpendicular magnetization film. The foundation layer 40X is formed by using the above-mentioned material (e.g., Ta).

For example, six periods of Co/Pd films ([Pt/Co]$_6$ films) 101X are deposited as the material of a first magnetic layer (magnetic body) 10X for forming the storage layer. However, a ferromagnetic material having an L1$_0$ structure or an L1$_1$ structure such as FePd, FePt, CoPd, or CoPt, a rare earth metal-transition metal magnetic material (ferrimagnetic material) such as TbCoFe, and artificial lattice that has a stack structure including a magnetic material such as NiFe and a nonmagnetic material such as Cu or Pd may be deposited as the magnetic layer 101X for forming the storage layer of the MTJ element.

When an interfacial layer 102X is formed in the storage layer 10X, for example, a CoFeB film 102X is deposited on the artificial lattice 101X.

The MgO film 20X is deposited on the magnetic film 10X as a nonmagnetic layer for forming the tunnel barrier layer.

The second magnetic film 30X for forming the reference layer is deposited on the MgO film 20X. When an interfacial layer is formed in the reference layer 30X, for example, a CoFeB/Ta/CoFeB film 302X is deposited on the MgO film 20X. When no interfacial layer is formed, the second magnetic film 301X is directly deposited on the MgO film 20X.

In the present embodiment, a rare earth metal-transition metal magnetic material (magnetic body) 301X to which boron (B) is added is used as a perpendicular magnetization film 301X included in the second magnetic film 30X. For example, a TbCoFe layer (TbCoFeB layer) 301X to which B is added is deposited on the CoFeB/Ta/CoFeB film 302X.

The TbCoFeB layer 301X is formed, for example, by sputtering a Tb target, a Co target, an FeB target, and an Fe target at the same time. As a result, the TbCoFeB layer 301X in the form of an alloy is deposited on the interfacial layer 302X (or on the MgO film 20X). The TbCoFeB layer 301X may be formed by sputtering a TbCoFeB alloy target.

Here, regarding the composition ratio of each component in the TbCoFeB layer 301X, the composition ratio (average content, concentration) of Tb is set at 20 at. % or more, and the sum of the composition ratios (average contents, concentrations) of Co and Fe is set at 30 at. % or more. When the composition ratios of Tb, Co, and Fe are set at the above-mentioned values in the TbCoFeB layer 301X, the composition ratio (average content, concentration) of B is set at 1 at. % or more and 50 at. % or less. When only Co is added to the rare earth metal-transition metal magnetic layer (when Fe is not included), the composition ratio of Co has only to be 30 at. % or more. On the contrary, when only Fe is added to the rare earth metal-transition metal magnetic layer (when Co is not included), the composition ratio of Fe has only to be 30 at. % or more. The conductive layer 45X as the hard mask is deposited on the TbCoFeB layer 301X. For example, a Ta/Ru stack film is used for the conductive layer 45X.

Thus, a stack structure 1X for forming the MTJ element is formed on the substrate 100.

A bias layer (shift adjustment layer) for counteracting (off-setting) a magnetic field leaking from the reference layer (magnetostatic stray field, leak magnetic field) may be formed between the conductive layer 45X and the TbCoFeB layer 301X. The bias layer includes a magnetic layer. The bias layer may be formed in the foundation layer 40X. Moreover, a nonmagnetic layer (e.g., metal layer) for reinforcing exchange bias may be formed between the bias layer and the TbCoFeB layer.

As shown in FIG. 4, a resist mask 90 having a predetermined shape (e.g., circular planar shape) is formed on the conductive layer 45A as the hard mask, for example, by photolithography and etching. On the basis of the patterned resist mask 90, the layers forming the stack structure on the substrate 100 are sequentially processed (patterned) from the mask side by anisotropic etching such as reactive ion etching (RIE) or ion milling. The components of the MTJ element (stack structure) may be processed by using a gas cluster ion beam (GCIB).

As a result, the stack structure (MTJ element) 1A having a predetermined shape is formed on the substrate 100. The processed stack structure 1A includes a foundation layer (lower electrode) 40A, a storage layer 10, a tunnel barrier layer 20, a reference layer 30A, and a hard mask (upper electrode) 45A.

As shown in FIG. 5, after the resist mask on the hard mask 45A is removed, a thin insulating film (hereinafter also referred to as a sidewall insulating film) 47 is deposited on the stack structure 1A to cover the surface of the processed stack structure 1A.

After the sidewall insulating film 47 is formed, for example, an interlayer insulating film 79 is deposited on the substrate 100, for example, by a chemical vapor deposition (CVD) method or a coating method. The interlayer insulating film 79 is made of silicon oxide ($SiO_2$) or SiN.

For example, the sidewall insulating film 47 is preferably dense silicon nitride (SiN) formed conformally by an atomic layer deposition (ALD) method. The conformal (high-coverage) SiN film 47 is thus formed such that no clearance is formed between the stack structure 1A and the insulating film 79.

Here, oxygen included in the oxide interlayer insulating film 79 may pass through the insulating film 47 and permeate the reference layer 30A because of the quality of the sidewall insulating film 47.

As in the present embodiment, as B is added to the magnetic layer (magnetic film) 30A made of a rare earth metal such as Tb, the B component (element) in the magnetic layer 30A reacts with oxide which has permeated. As a result, the oxidization of Tb in the magnetic layer is inhibited by B, and Tb that contributes to the magnetization of the magnetic layer 30A is oxidized only in the surface, so that Tb remains hardly oxidized in the magnetic layer 30A. For example, B in the magnetic layer 30A, 301A diffuses (migrates) toward the surface (processed surface) of the magnetic layer 30A, 301A.

When oxygen in the manufacturing process of the MTJ element is present in the vicinity of the rare earth metal-transition metal magnetic layer 30A, boron (B) is added to the magnetic layer 30A according to the present embodiment, boron oxide is formed on the surfaces (processed surface) of the magnetic layers 30A and 301A. And an oxide of the rare earth metal (e.g., Tb) that contributes to the magnetization of the magnetic layer 30A is hardly formed in the magnetic layer 30A.

Therefore, even in the manufacturing process in which films are deposited and processed in a vacuum, the corrosion of the surface of the magnetic layer (element) caused by oxygen can be inhibited by adding boron to the rare earth metal-transition metal magnetic layer of the MTJ element so that the corrosion resistance of the magnetic layer is improved in advance.

As shown in FIG. 6, the upper surface of the interlayer insulating film 79 is planarized by a chemical mechanical polishing (CMP) method, and the interlayer insulating film 79 and the insulating film 47 are ground. The upper surface of the hard mask layer (upper electrode) 45A of the MTJ element 1A is exposed. Interconnects made of, for example, Cu or Al are formed on the exposed upper electrode 45A by a known technique.

The MTJ element 1A according to Configuration example 1 of the present embodiment is formed by the process described above.

In the process of manufacturing the MTJ element according to the present embodiment, the B-added rare earth metal-transition metal magnetic layer (e.g., TbCoFeB layer) 301A is formed as the magnetic layer (here, the reference layer) for forming the MTJ element.

Boron (B) is added (doped, contained) to the TbCoFe layer to inhibit the oxidization of Tb included in this magnetic layer. As a result, a perpendicular magnetization film having corrosion resistance (e.g., oxidation resistance), low saturation magnetization Ms, and high coercive force Hc can be formed by using the B-doped rare earth metal-transition metal magnetic layer (e.g., TbCoFeB layer).

Accordingly, the deterioration of the magnetic characteristics of the rare earth metal-transition metal magnetic layer caused by the oxidization can be inhibited, and the deterioration of the characteristics of the MTJ element can be inhibited.

Consequently, according to the magnetoresistive effect element manufacturing method of the present embodiment, it is possible to provide a magnetoresistive effect element in which element characteristic deterioration is inhibited.

(2) Configuration Example 2

The structure of a magnetoresistive effect element (e.g., MTJ element) according to Configuration example 2 of the first embodiment is described with reference to FIG. 7.

Figure 7:
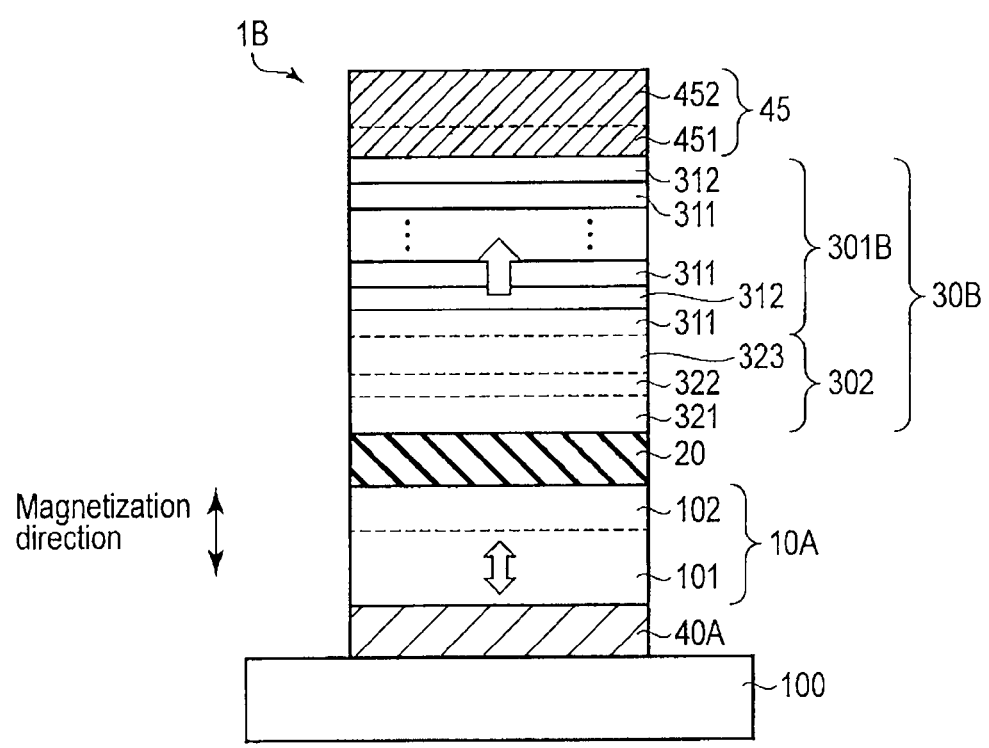
FIG. 7 is a sectional view showing a structural example of the magnetoresistive effect element according to the first embodiment.

FIG. 7 shows the sectional structure of an MTJ element 1B according to Configuration example 2 of the first embodiment. In FIG. 7, an insulating film over the MTJ element 1B is not shown.

In the MTJ element 1A according to Configuration example 1, the TbCoFeB layer in the reference layer is made of an alloy. However, as in the MTJ element 1B according to Configuration example 2, a TbCoFeB layer 301B in a reference layer 30B may be made of artificial lattice.

Hereinafter, for clarification of explanation, the TbCoFeB layer of the artificial lattice is referred to as a TbCoFeB artificial lattice, and the alloy TbCoFeB layer is referred to as a TbCoFeB alloy.

The TbCoFeB artificial lattice 301B in the reference layer 30B is formed by a stack structure including a TbCo film 311 and an FeB film 312. A single TbCo film and a single FeB film form one period of the artificial lattice 301B. The stack structure of one period in the artificial lattice 301B is represented as an FeB/TbCo layer (or TbCo/FeB layer). The artificial lattice in which the stacking period of the FeB/TbCo layer is n periods is represented as $[FeB/TbCo]_n$. In Configuration example 2, the period of the artificial lattice 301B in the reference layer 30B is 15 periods.

In each TbCo film 311 of the artificial lattice 301B, the composition ratio (average content, concentration) of Tb is set at about 70 at. %, and the composition ratio of Co is set at about 30 at. %. This TbCo film ($Tb_{70}Co_{30}$ film) has a thickness of about 0.5 nm (5 angstroms).

In each FeB film 312 of the artificial lattice 301B, the composition ratio of Fe is set at about 80 at. %, and the composition ratio of B is set at about 20 at. %. This FeB film ($Fe_{80}B_{20}$ film) has a thickness of about 0.3 nm (3 angstroms).

When it is not necessary to mention the composition ratio of each film, the films are hereinafter referred to simply as a TbCo film and an FeB film.

In the reference layer 30B of the MTJ element 1B according to Configuration example 2, the artificial lattice 301B having an $[Fe_{80}B_{20}/Tb_{70}Co_{30}]_{15}$ structure is provided on an interfacial layer 302.

As in the case where the TbCoFeB alloy is used for the reference layer, regarding the composition ratio of each component in the whole TbCoFeB artificial lattice 301B, the composition ratio (average content, concentration) of Tb is set at 20 at. % or more, and the sum of the composition ratios (average contents, concentrations) of Co and Fe is set at 30 at. % or more. When the composition ratios of Tb, Co, and Fe are set at the above-mentioned values in the TbCoFeB layer 301B, the composition ratio of B is set at 1 at. % or more and 50 at. % or less.

The configuration and composition ratio of the TbCoFeB artificial lattice 301E is not limited to the above-mentioned example. The TbCoFeB artificial lattice 301B is not limited to the above-mentioned stack structure, periods, and composition ratios as long as the TbCoFeB artificial lattice 301B includes a rare earth metal, a transition metal, and boron. For example, an artificial lattice that uses a TbFe film and a CoB film may be used. For example, it is possible to use an artificial lattice in which 15 periods of $Tb_{70}Co_{30}$ films having a thickness of 0.5 nm, and Fe films having a thickness of 0.24 nm, and B films having a thickness of 0.6 nm are stacked.

A method of manufacturing the MTJ element 1B including the TbCoFeB artificial lattice 301B is substantially the same in other respects as the method of manufacturing the MTJ element 1A the TbCoFeB alloy 301A except for a sputtering step of forming the TbCoFeB layer 301B.

When the TbCoFeB artificial lattice in the reference layer 30B is formed in Configuration example 2, a Tb target and a Co target are sputtered at the same time, and an artificial lattice TbCo film is deposited. An FeB target and an Fe target are sputtered at the same time, and an artificial lattice FeB film is deposited on the formed TbCo film. Thus, TbCo films and FeB films are alternately deposited to reach a predetermined stacking number (periods) such that the TbCoFeB artificial lattice 301B is formed.

For example, as in Configuration example 1, the stack structure including the TbCoFeB artificial lattice 301B is processed into a predetermined element shape, and then the processed stack structure is exposed to an atmosphere containing oxygen (e.g., air). The coercive force Hc of the reference layer 30B including the TbCoFeB artificial lattice 301B exposed to the air is about 8 kOe, which is substantially similar to the coercive force Hc of the TbCoFeB alloy 301A of the MTJ element 1A according to Configuration example 1.

Thus, even when the TbCoFeB layer 301B in the form of an artificial lattice having a multilayer structure is formed, the oxidization of the Tb component in the TbCoFeB artificial lattice 301B can be inhibited by adding boron (B) to the TbCoFe artificial lattice, as in the case where the TbCoFeB layer 301 in the form of an alloy having a single-layer structure is formed.

Although B is added to the Fe film in the TbCoFeB artificial lattice 301B of the reference layer 30B of the MTJ element 1B according to Configuration example 2 in the example shown, this is not a limitation. For example, as in the case where a B-doped Tb film forms one film of artificial lattice or where a B-doped Co film forms one film of artificial lattice, the deterioration of the magnetic characteristics of the TbCoFeB artificial lattice 301B caused by the oxidization can be inhibited as described above even when the combination of the compositions of the films (lattice) of the TbCoFeB artificial lattice is properly changed.

As described above, characteristic deterioration of the magnetoresistive effect element 1B according to Configuration example 2 of the first embodiment can be inhibited.

(3) Relation Between Composition Ratio and Magnetic Characteristics of Rare Earth Metal-Transition Metal Magnetic Layer The relation between the composition ratio and magnetic characteristics of the rare earth metal-transition metal magnetic layer used in the magnetoresistive effect element according to the present embodiment is described with reference to FIG. 8.

As described above, the magnetoresistive effect element according to the first embodiment includes the boron (B)-doped rare earth metal-transition metal magnetic layer (e.g., TbCoFeB layer). The TbCoFeB layer is provided in the reference layer of the MTJ element.

B is added to the TbCoFe layer such that the corrosion resistance (e.g., oxidation resistance) of the magnetic layer including the TbCoFe layer is improved and the magnetic characteristics of the magnetic layer including the TbCoFe layer can be improved.

Here, the relation between the composition ratio and magnetic characteristics of the boron-doped rare earth metal-transition metal magnetic layer is described.

FIG. 8 shows the relation between the composition ratio and coercive force of each element in the TbCoFeB layer as the boron-doped rare earth metal-transition metal magnetic layer. The coercive force Hc (unit: kOe) of the magnetic layer (TbCoFeB layer) shown in FIG. 8 is the coercive force of the magnetic layer after exposure to an atmosphere containing oxygen. The TbCoFeB layer in FIG. 8 is an artificial lattice.

In Sample 1 shown in FIG. 8, the composition ratio of Tb in the TbCoFeB layer is set at 44 at. %, the composition ratio of Co is set at 18 at. %, the composition ratio of Fe is set at 38 at. %, and the composition ratio of B is set at 0 at. %. That is, the rare earth metal-transition metal magnetic layer of Sample 1 is a TbCoFe layer which is not doped with B. The coercive force Hc of this TbCoFe layer after exposure to the oxygen atmosphere is about 4 kOe.

In Sample 2 shown in FIG. 8, the composition ratio of B is set at 0.5 at. %, the composition ratio of Co is set at 18.5 at. %, and the composition ratio of Fe is set at 37 at. %. In Samples 1 to 8 shown in FIG. 8, the composition ratio of Tb in the TbCoFeB layers is fixed at 44 at. %. As shown in the TbCoFeB layer of Sample 2, the coercive force of the TbCoFeB layer exposed to the oxygen atmosphere is improved as compared to that of the TbCoFe layer to which B is not added, even if the addition amount of B is small (0.5 at. %).

In the TbCoFeB layer of Sample 3 shown in FIG. 8, the composition ratio of Tb is set at 44 at. %, the composition ratio of Co is set at 18.5 at. %, the composition ratio of Fe is set at 36.5 at. %, and the composition ratio of B is set at 1 at. %. In this case, the coercive force Hc of the TbCoFeB layer (B: 1 at. %) of Sample 3 is about 5.5 kOe. The coercive force Hc of Sample 3 is improved as compared to Samples 1 and 2. Moreover, as shown in Samples 4 and 5 in FIG. 8, the composition ratio of B in the TbCoFeB layer is increased to 2.5 at. % and 5 at. %, and the coercive force Hc of the TbCoFeB layer is improved to about 6 to 7 kOe.

As shown in Samples 6 and 7 in FIG. 8, when the composition ratio of B in the TbCoFeB layer is 10 to 20 at. %, the coercive force Hc of the magnetic layer is saturated at about 8 kOe. As shown in Sample 8 in FIG. 8, when the composition ratio of B is 25 at. %, the coercive force Hc sharply drops. The coercive force Hc of the TbCoFeB layer of Sample 8 is about 3 kOe.

In Samples 9, 10, 11, and 12 in FIG. 8, the composition ratio of B in the TbCoFeB layer is fixed at 10 at. %, and the composition ratios of Tb, Co, and Fe in the TbCoFeB layer are varied.

In the TbCoFeB layer of Sample 9, the composition ratio of Tb is set at 40.5 at. %. In the magnetic layer of Sample 10, the composition ratio of Tb is set at 37.5 at. %. In this case, the coercive force Hc of the magnetic layer of Sample 9 is about 7 kOe, and the coercive force Hc of the magnetic layer of Sample 10 is about 6 kOe. Thus, the coercive force Hc of the TbCoFeB layers of Samples 9 and 10 is lower than the coercive force Hc of the TbCoFeB layer (Tb: 44 at. %) of Sample 6 and the coercive force of the magnetic layer of Sample 7.

The composition ratio of Tb in the TbCoFeB layers of Samples 11 and 12 is higher than the composition ratio (44 at. %) of Tb in the TbCoFeB layers of Samples 1 to 8.

In the TbCoFeB layer of Sample 11, the composition ratio of Tb is set at 50 at. %. In this case, the coercive force Hc of the TbCoFeB layer of Sample 11 is about 8 kOe. This value is about the same as that of the TbCoFeB layers of Samples 6 and 7.

In the TbCoFeB layer of Sample 12, the composition ratio of Tb is set at 54 at. %. In this case, the coercive force Hc of the TbCoFeB layer of Sample 12 is about 6 kOe, and is lower than the coercive force Hc of the TbCoFeB layers of Samples 5, 6, 7, 9, and 11.

Thus, the magnetic characteristics (e.g., coercive force) of the B-added rare earth metal-transition metal magnetic layer can be adjusted by changing the composition ratio of each element included in the B-added rare earth metal-transition metal magnetic layer (here, TbCoFeB layer).

For example, the composition ratio of B in the TbCoFeB layer is preferably more than 0 and less than 25 at. %. For example, when the composition ratio of B is set at about 10 at. %, the composition ratio of Tb in the TbCoFeB layer preferably ranges from 40 at. % to 50 at. %.

[2] Second Embodiment

A magnetoresistive effect element according to the second embodiment is described with reference to FIG. 9 to FIG. 17. Components in the magnetoresistive effect element according to the second embodiment having the same configuration and function as the magnetoresistive effect element according to the first embodiment are explained when necessary.

In the magnetoresistive effect element according to the present embodiment, an interface is provided in a boron (B)-added (doped) rare earth metal-transition metal magnetic layer. The interface in the rare earth metal-transition metal magnetic layer inhibits the diffusion and segregation of B.

(1) Configuration Example 1

The structure of an MTJ element according to Configuration example 1 of the second embodiment is described with reference to FIG. 9 and FIG. 10.

FIG. 9 shows the sectional structure of an MTJ element 1C according to Configuration example 1.

In the MTJ element 1C in FIG. 9, a rare earth metal-transition metal magnetic layer 301C of a reference layer 30C is made of, for example, a TbCoFeB artificial lattice. For example, as in the example shown in FIG. 7, the two kinds of films for forming the artificial lattice are a $Tb_{70}Co_{30}$ film having a thickness of 0.5 nm and an $Fe_{80}B_{20}$ film having a thickness of 0.3 nm.

A stack film (FeB/TbCo film) 315 including one TbCo film and one FeB film form one layer (lattice, period) in the artificial lattice 301C.

In the MTJ element 1C according to Configuration example 1, a Ta film is inserted in every three periods of FeB/TbCo films (i.e., 3×[FeB/TbCo]). A structure in which a Ta film of about 0.1 nm (1 angstrom) is provided in every three periods of FeB/TbCo ($[FeB/TbCo]_3$) stack structures (lattice structures) 331 is repeated five times. A Ta film (first layer) 316 intervenes between two $[FeB/TbCo]_3$ structures.

The Ta film inserted in the TbCoFeB artificial lattice 301C has the property of more easily combining with B than Tb, Co, and Fe among the components in the TbCoFeB artificial lattice 301C.

In the MTJ element 1C according to Configuration example 1 of the second embodiment, the TbCoFeB artificial lattice 301C as a perpendicular magnetization film in the reference layer 30C has a stack structure of 5×(Ta/[FeB/TbCo]$_3$).

The number (period) of the FeB/TbCo films 315 included in a stack structure 331 or the number of the stack structures 331 in the TbCoFeB artificial lattice 301C are not limited to the above-mentioned numbers.

For example, the Ta film 316 is inserted for every predetermined stacking numbers (e.g., three FeB/TbCo films) by sputtering during the formation of the artificial lattice.

The Ta film 316 is inserted in the TbCoFeB artificial lattice such that the TbCo film and the FeB film forming the artificial lattice 301C are discontinuous at the position where the Ta film 316 is inserted. That is, predetermined periods of the FeB/TbCo films 331 in the TbCoFeB artificial lattice 301C are physically divided in the artificial lattice 301C by the inserted Ta films 316.

In the MTJ element 1C according to Configuration example 1, the TbCoFeB artificial lattice 301C has therein an interface resulting from the Ta film 316. Hereinafter, the Ta film 316 as the interface in the TbCoFeB layer 301C is also referred to as an insertion film.

When the magnetic film 30C that includes the TbCoFeB artificial lattice 301C having the interface formed by the Ta film 316 is annealed at 280° C. for 30 minutes, the coercive force Hc of the TbCoFeB artificial lattice 301C is about 17 kOe.

When the stack structure that includes the TbCoFeB artificial lattice 301C having the Ta film 316 as the interface is processed into a predetermined element shape after being annealed, the coercive force Hc of the processed TbCoFeB artificial lattice 301C is about 10 kOe.

Thus, the coercive force Hc of the reference layer 30C that includes the TbCoFeB artificial lattice 301C having the Ta film 316 as the interface has a higher value than the coercive force Hc (about 8 kOe) of the TbCoFeB layer (alloy or artificial lattice) that includes no interface as in the reference layer of the magnetoresistive effect element according to the first embodiment.

When the TbCoFeB artificial lattice 301C having the Ta film 316 as the interface is neither annealed nor processed, the TbCoFeB artificial lattice 301C has a coercive force of about 20 kOe.

Even if the thickness of the inserted Ta film 316 is increased to 0.5 nm (5 angstroms), the overall magnetization of the TbCoFeB artificial lattice 301C is switched by spin transfer switching (the supply of a magnetization switching threshold current) in the TbCoFeB artificial lattice 301C in which the Ta film 316 is inserted and the entire reference layer 30C. That is, even if the TbCo/FeB films 331 are divided by the Ta films 316, the magnetization directions of the films 331 in the TbCoFeB artificial lattice 301C are the same and are switched together (in cooperation). The thickness of the Ta film 316 in the TbCoFeB artificial lattice 301C is preferably 1.0 nm or less so that the overall magnetization of the TbCoFeB artificial lattice 301C in which the Ta film 316 as the interface is inserted is switched at once.

In the magnetoresistive effect element (MTJ element) 1C according to Configuration example 1 of the second embodiment, boron (B) is added to the rare earth metal-transition metal magnetic layer 301C while the interface is being formed (inserted) in the magnetic layer 301C. In the MTJ element 1C according to Configuration example 1, the insertion film 316 including a Ta film is formed as the interface in the boron-doped (added) rare earth metal-transition metal magnetic layer (e.g., TbCoFeB artificial lattice) 301C.

Generally, in a semiconductor device manufacturing process, annealing at about 250° C. to 300° C. is conducted in a wafer process.

When annealed (heated), boron (B) tends to diffuse to a layer different from the layer (here, FeB layer) that includes boron, or tends to segregate in the interface between adjacent layers.

It has been observed by the measurement using an XPS depth profile that the deterioration of the coercive force Hc of the TbCoFe layer caused by annealing is mainly attributed to the movement of B.

In the B-added TbCoFe layer 301C, the movement of B in the TbCoFeB layer 301C is blocked by the Ta film 316. This can inhibit the diffusion and segregation of B in or out of the TbCoFeB layer 301C caused by heat.

As a result, the deterioration of the magnetic characteristics (e.g., coercive force) of the TbCoFeB layer 301C caused by the diffusion and segregation of B can be inhibited.

Therefore, in Configuration example 1, an extremely thin film made of a material that easily combines with B such as the Ta film is inserted in the TbCoFeB film such that the nonuniformity of the composition in the magnetic layer attributed to the movement of B is inhibited and the heat resistance of the magnetic layer and the MTJ element 1C that includes this magnetic layer can be improved.

Furthermore, the inhibition of the diffusion and segregation of B caused by the Ta film in the TbCoFeB layer 301C allows a larger process margin and lower manufacturing costs of the device (e.g., MRAM) including the MTJ element 1C.

As the insertion film (Ta film) is provided, a layer in which the concentration of an element (nonmagnetic element) attributed to the insertion film in the TbCoFeB artificial lattice 301C is localized is formed in the TbCoFeB artificial lattice. When a heat treatment is conducted in the process of forming the MTJ element, the localization of Ta is reduced due to diffusion thereof or of B or other elements. The concentration (composition ratio) of the nonmagnetic element (e.g., Ta) localized in the TbCoFeB artificial lattice 301C is, for example, more than 20 at. %. As the composition ratio of Ta in the artificial lattice 301C is more than 20 at. %, the nonmagnetic element (here, Ta) has the effect of inhibiting the diffusion of B through the magnetic layers.

For example, in the FeB/TbCo film 315 intervening between the Ta films 316, the concentration of B on the side of the Ta film 316 may be equal to or higher than the concentration of B in the center of the FeB/TbCo film 315. Therefore, the layer intervening between the Ta films in the TbCoFeB layer 301C may vary in B concentration in a direction perpendicular to the film plane (stacking direction).

When a film made of at least one of the substances selected from the group including of W, hafnium (Hf), zirconium (Zr), Nb, Mo, vanadium (V), chromium (Cr), silicon (Si), germanium (Ge), and nitrides of these substances is inserted in the TbCoFeB artificial lattice 301C instead of the Ta film, the magnetic characteristics of the reference layer 30C that includes the TbCoFeB artificial lattice 301C after a heating process are also improved. When a metal film of W and No or a semiconductor film of Si or a nitride of such a substance is used for the insertion film (interface) in the TbCoFeB artificial lattice 301C, advantageous effects similar to those obtained when the Ta film is inserted are obtained.

Even when the Ta film as the interface is provided in the TbCoFeB alloy, advantageous effects substantially similar to those obtained from the artificial lattice 301C are obtained.

FIG. 10 shows a modification of the MTJ element 1C shown in FIG. 9.

In a TbCoFeB layer 301C' of an MTJ element 1C' shown in FIG. 10, films 331 and 333 disposed across an insertion film 316 are different from each other in the composition ratio (concentration) of boron included therein.

For example, the composition ratio of B is set at about 3.8 at. % in one film (TbCoFeB stack structure) 331 of the two films (also referred to as boron-doped films) 331 and 333 disposed across the insertion film 316, while the composition ratio of B is set at about 7.5 at. % in the other film (TbCoFeB stack structure) 333.

In the MTJ element 1C' according to the modification shown in FIG. 10, a microcrystal grain boundary resulting from the difference of composition concentration in the TbCoFeB layer 301C' is generated in the TbCoFeB layer 301C' in addition to the interface formed in the TbCoFeB layer by the insertion film 316. The microcrystal grain boundary further contributes to the inhibition of the diffusion and segregation of B in the TbCoFeB layer 301C' caused by heat. Thus, the annealing resistance of the MTJ element 1C' is improved.

As described above, the magnetoresistive effect element according to Configuration example 1 of the second embodiment allows the characteristic deterioration thereof to be inhibited.

(2) Configuration Example 2

The structure and manufacturing method of an MTJ element according to Configuration example 2 of the second embodiment are described with reference to FIG. 11 to FIG. 15.

The structure of the MTJ element according to Configuration example 2 of the second embodiment is described with reference to FIG. 11.

FIG. 11 shows the sectional structure of an MTJ element 1D according to Configuration example 2.

As shown in FIG. 11, a discontinuous surface (hereinafter also referred to as a physical etched layer or a discontinuous layer) produced by etching is provided in a TbCoFeB film 301D of a reference layer 30D instead of the insertion film (e.g., Ta film).

In Configuration example 2, the TbCoFeB film 301D is a TbCoFeB artificial lattice, as in the MTJ element 1 in FIG. 9.

For example, discontinuous layers (first layers) 319 produced by etching are provided as interfaces in the TbCoFeB layer (artificial lattice or alloy) 301D for every stack structure (lattice structures) 331 including five periods of FeB/TbCo films 315. The number (period) of the FeB/TbCo films 315 included in a stack structure 331 is not exclusively five. For example, the TbCoFeB layer 301D includes, but is not limited to, three stack structures 331.

In an MTJ element 1D' shown in FIG. 12, films (stack structure) 331 and 333 disposed across a discontinuous layer 319 as an interface may be different from each other in the composition ratio of B in a TbCoFeB layer 301D' of a reference layer 30D', as in the MTJ element 1C' shown in FIG. 10.

As in the MTJ element 1D shown in FIG. 11 and FIG. 12, the TbCoFeB layer that includes the discontinuous layer 319 as the interface is formed in the following manner.

Figure 13:
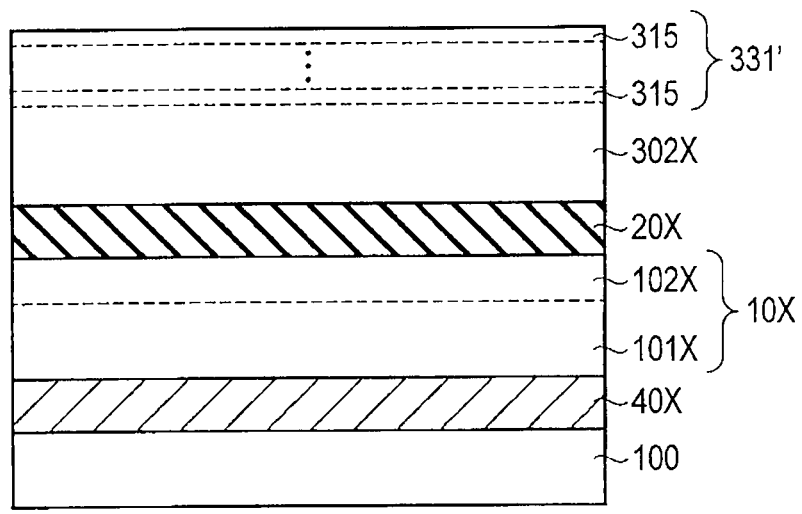
FIG. 13 to FIG. 15 are sectional process views showing an example of a method of manufacturing the magnetoresistive effect element according to the second embodiment.
Figure 14:
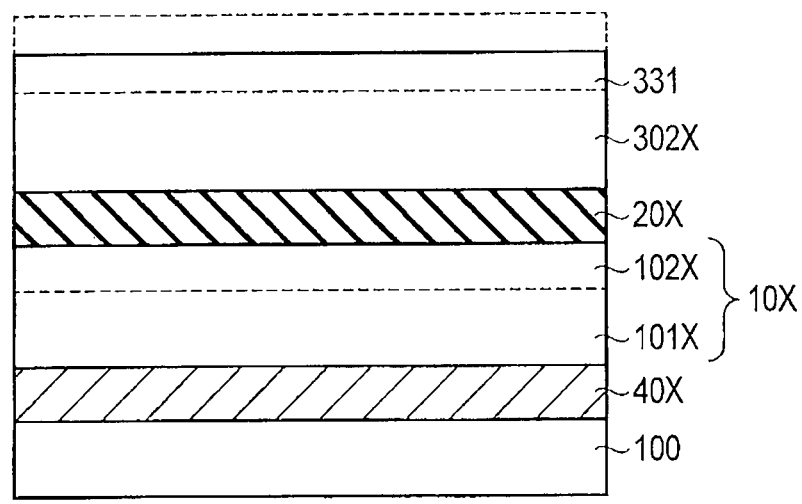
Figure 15:
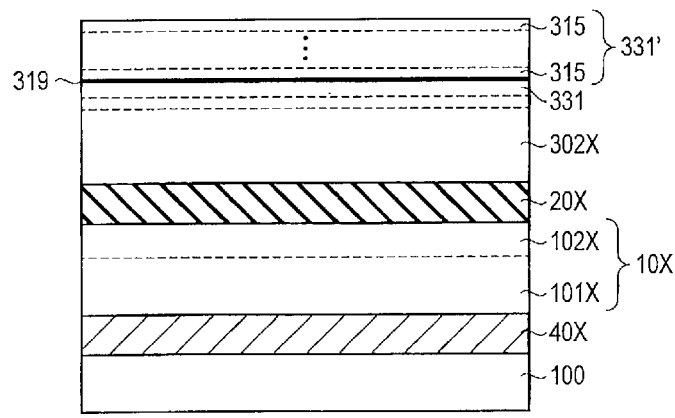

FIG. 13 to FIG. 15 show steps in the process of manufacturing the MTJ element according to Configuration example 2 of the second embodiment.

As shown in FIG. 13, for example, a stack structure 331' including eight periods of TbCo/FeB stack films 315 is formed on an interfacial layer on a nonmagnetic layer 20X.

As shown in FIG. 14, three periods of FeB/TbCo stack films 315' are then etched by sputtering. As a result, the stack structure 331 including five periods of FeBTbCo/FeB stack films 315 is formed. The upper surface of the physical-etched stack structure 331 becomes rough atomically due to, for example, physical etching (for example, sputter etching or ion milling).

As shown in FIG. 15, eight periods of stack structures 331' are then deposited on the remaining five periods of stack structures 331. As a result, the five periods of stack structures 331 and the eight periods of stack structures 331' are layers that are not continuous on an atomic layer level, and a discontinuous surface (discontinuous layer) 319 resulting from sputtering (physical etching) is formed as an interface between the five periods of stack structures 331 and the eight periods of stack structures 331'. Three periods of layers of the eight periods of stack structures 331' are then removed by physical etching (sputter etching or ion milling).

The formation of the FeB/TbCo stack structures 331 and the physical etching of some of the stack films are repeated until the periods of FeB/TbCo stack structures 331 reach a predetermined stacking number (e.g., three). The discontinuous surface 319 as the interface is then formed in the TbCoFeB artificial lattice 301D by physical etching.

In the example shown here, eight periods of TbCo/FeB stack films are formed, and three of the eight periods of TbCo/FeB stack films are removed by physical etching, and the discontinuous layer 319 as the interface is formed. However, the periods of the stack films are not limited to the above-mentioned number. For example, ten periods of TbCo/FeB stack films may be formed, and five of the ten periods of TbCo/FeB stack films may be removed by physical etching. In this case as well, the discontinuous layer 319 as the interface is formed between the TbCoFeB artificial lattice stack structures 331.

In the reference layer 30D of the MTJ element 1D according to Configuration example 2, when the TbCoFeB artificial lattice 301D having the discontinuous surface 319 as the interface is annealed at 280° C. for 30 minutes without being processed, the coercive force Hc of the TbCoFeB artificial lattice 301D having the discontinuous surface 319 after being annealed is about 15 kOe. When the TbCoFeB artificial lattice 301D having the discontinuous surface 319 after annealing is processed into a predetermined element shape, the coercive force of the processed and annealed TbCoFeB artificial lattice 301D is about 9 kOe. As described above, the TbCoFeB artificial lattice having no interface formed in the TbCoFe layer has a coercive force of about 8 kOe as a result of annealing and formation (processing).

Thus, in the TbCoFeB layer 301D that includes the discontinuous layer 319 resulting from the physical etching (sputter etching or ion milling) as the interface, the diffusion and segregation of B is inhibited by the discontinuous layer (physical etched layer) 319 as the interface and the coercive force Hc is improved after annealing, as compared to the TbCoFeB layer in which no interface is formed.

When the TbCoFeB artificial lattice 301D having the discontinuous layer (discontinuous surface) 319 as the interface is neither processed nor annealed, this artificial lattice has a coercive force of about 20 kOe.

Even when an interface produced by physical etching is formed in the TbCoFeB layer (TbCoFeB artificial lattice) 301D and becomes a discontinuous layer, the overall magnetization of the TbCoFeB layer 301D is switched by spin transfer switching.

Even when the discontinuous surface 319 produced by etching is formed in the TbCoFeB layer 301D and the discontinuous layer 319 as the interface is provided in the TbCoFeB layer 301D as described above, the discontinuous surface produced by etching serves as the interface to inhibit the diffusion and segregation of B, as in the case where the insertion film is provided in the TbCoFeB layer.

Thus, the interface that makes the TbCoFeB layer 301D discontinuous can be formed in this layer 301D by a manufacturing process such as etching, in contrast with an insertion film such as a Ta film that physically divides the stack films in the TbCoFeB artificial lattice.

In the reference layer 30D of the MTJ element 1D according to Configuration example 2 as well, the diffusion and segregation of B in the TbCoFeB layer 301D can be inhibited by the interface produced by physical etching, and the deterioration of the magnetic characteristics of the TbCoFeB layer 301D caused by the diffusion and segregation of B can be inhibited.

As described above, the magnetoresistive effect element according to Configuration example 2 of the second embodiment allows the characteristic deterioration thereof to be inhibited, as in the MTJ element 1C shown in FIG. 9 and FIG. 11.

(3) Configuration Example 3

The structure and manufacturing method of an MTJ element according to Configuration example 3 of the second embodiment are described with reference to FIG. 16.

Figure 16:
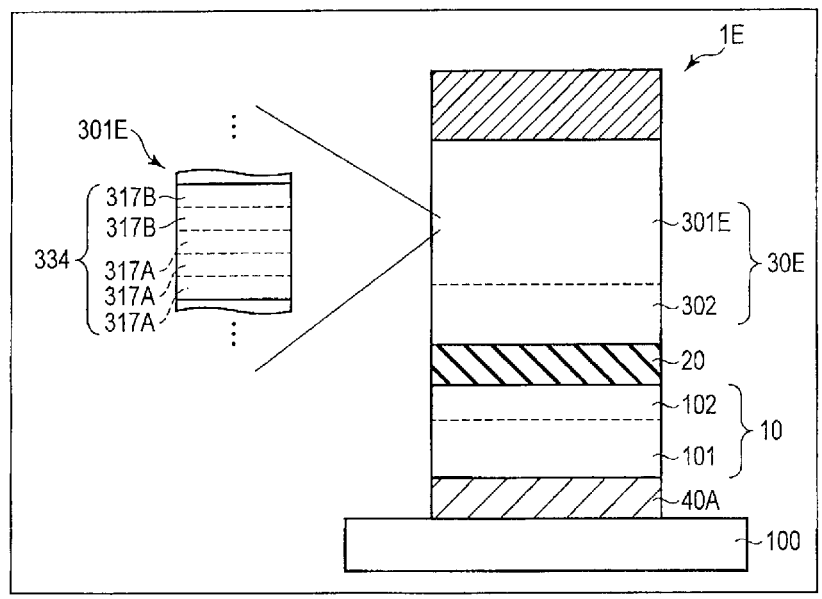
FIG. 16 is a sectional view showing a structural example of the magnetoresistive effect element according to the second embodiment.

FIG. 16 shows the sectional structure of an MTJ element 1E according to Configuration example 3.

In a TbCoFeB layer (e.g., TbCoFeB artificial lattice) 301E in a reference layer 30E, films different in the composition ratio (concentration) of B are stacked. An interface is formed between films 334 different in the composition ratio of B.

Here, a stack film 317A including a $Tb_{70}Co_{30}$ film of 0.5 nm and an $Fe_{80}B_{20}$ film of 0.3 nm is represented as an "A-ML layer 317A". A stack film 317B including a $Tb_{70}Co_{30}$ film of 0.5 nm and an $Fe_{60}B_{40}$ film of 0.3 nm is represented as a "B-ML layer 317B".

In this case, the concentration of boron (B) in the B-ML layer 317B is higher than the concentration of boron in the A-ML layer 317A. For example, the concentration of boron in the whole B-ML layer 317B is about 15 at. %, and the concentration of B in the whole A-ML layer 317A is about 3.8 at. %.

For example, three periods of the A-ML layers 317A and two periods of the B-ML layers 317B are stacked to form a stack structure ([3×A-ML+2×B-BL] structure) 334, and the stack structure 334 is repeated three times. The TbCoFeB artificial lattice 301E having this structure is represented as [3×A-ML+2×B-BL]$_3$.

Thus, in the TbCoFeB layer (artificial lattice) 301E included in the reference layer 30E of the MTJ element 1E according to Configuration example 3, the A-ML layers 317A having a given composition ratio (concentration) of boron and the B-ML layers 317B different in the composition ratio (concentration) of boron from the A-ML layers 317A are stacked. As a result, an interface attributed to a microcrystal grain boundary resulting from the difference of composition concentration is formed between the layers 317A and 317B different in the composition ratio of boron.

In the TbCoFeB artificial lattice 301E included in the MTJ element 1E according to Configuration example 3, the composition ratio and stacking number of films/layers are not limited to the above-mentioned values as long as a stack structure of layers different in the concentration of boron is used. The TbCoFeB layer 301E included in the MTJ element 1E according to Configuration example 3 is not limited to the artificial lattice, and may be an alloy.

In Configuration example 3, when the TbCoFeB artificial lattice 301E including the layers different in the composition ratio of B is annealed at 280° C. for 30 minutes without being processed, the coercive force Hc of the TbCoFeB artificial lattice 301E after being annealed is about 15 kOe. When the TbCoFeB artificial lattice 301E after annealing is processed (fabricated) into a predetermined element shape, the coercive force of the processed and annealed TbCoFeB artificial lattice 301E is about 9 kOe. When the TbCoFeB artificial lattice 301E is neither processed nor annealed, this artificial lattice has a coercive force of about 20 kOe.

As described above, the TbCoFeB artificial lattice having no interface formed in the TbCoFeB layer has a coercive force of about 8 kOe as a result of annealing and formation (processing).

Thus, the TbCoFeB artificial lattice that includes the interface formed by the difference of the composition ratio of B is higher in coercive force than the TbCoFeB artificial lattice that includes no interface.

The composition (concentration) in the TbCoFeB artificial lattice 301E of Configuration example 3 can be analyzed and measured by narrowing down a spot diameter to about 1 nm in TEM-EELS in which electron energy-loss spectroscopy (EELS) is combined with transmission electron microscopy (TEM).

As described above, the magnetoresistive effect element according to Configuration example 3 of the second embodiment allows the characteristic deterioration thereof to be inhibited, as in Configuration examples 1 and 2 of the second embodiment.

(4) Configuration Example 4

An MTJ element according to Configuration example 4 of the second embodiment is described with reference to FIG. 17.

For example, as in the MTJ element in each of the above-described examples, an interfacial layer 302 is provided between a tunnel barrier layer 20 and a TbCoFeB layer 301E in a reference layer 30E in FIG. 16. The interfacial layer 302 is formed by using, for example, a CoFeB film.

In the CoFeB film as the interfacial layer, boron (B) included in the interfacial layer 302 may diffuse toward the TbCoFeB layer 301E due to annealing in the manufacturing process.

If a large quantity of B is present in the vicinity of the interface between the TbCoFeB layer 301E and the interfacial layer 302, boron derived from the interfacial layer 302 does not diffuse, and boron remaining in the interfacial layer 302 may decrease the MR ratio of the MTJ element.

FIG. 17 is a graph showing the relation between the MR ratio of the magnetoresistive effect element (MTJ element) and the concentration of boron in the vicinity of the interfacial layer. The vertical axis in FIG. 17 indicates the MR ratio (unit: %) of the MTJ element. The horizontal axis in FIG. 17 indicates the concentration (unit: at. %) of boron in a region located 2 nm in the vicinity of the interfacial layer.

FIG. 17 shows that the MR ratio of the MTJ element tends to decrease when the concentration of boron increases in the vicinity of the interfacial layer.

Therefore, in order to obtain an MTJ element having a high MR ratio, it is preferable to decrease the concentration (composition ratio) of boron included in the interfacial layer within a reference layer or the concentration of boron in the region located in the vicinity of the interfacial layer (e.g., in the vicinity of the interface between the TbCoFeB layer and the interfacial layer or in the vicinity of the interface between the interfacial layer and the tunnel barrier layer).

More specifically, it is preferable that the concentration of B in the region extending to a part 2 nm from the interface between the CoFeB film as the interfacial layer and the TbCoFeB layer is lower than the concentration of B in the layers (e.g., the TbCoFeB layer) other than the interfacial layer within the reference layer.

This can inhibit the decrease of the MR ratio of the MTJ element attributed to high-concentration boron (B) present in the vicinity of the interface between the interfacial layer and the TbCoFeB layer. Thus, an MTJ element having a high MR ratio can be provided according to Configuration example 4 of the second embodiment.

In Configuration example 4, the element concentration in the vicinity of the interface between the TbCoFeB layer and the interfacial layer can be analyzed and measured by narrowing down a spot diameter to about 1 nm in TEM-EELS in which electron energy-loss spectroscopy (EELS) is combined with transmission electron microscopy (TEM), as in Configuration example 3.

As described above, the magnetoresistive effect element according to Configuration example 4 of the second embodiment allows the characteristic deterioration thereof to be inhibited, as in Configuration examples 1 to 3 of the second embodiment.

[3] Third Embodiment

A magnetoresistive effect element according to the third embodiment is described with reference to FIG. 18 to FIG. 24. Components in the magnetoresistive effect element according to the third embodiment having the same configuration and function as the magnetoresistive effect elements according to the first and second embodiments are explained when necessary.

In the examples described in the first and second embodiments, boron (B) is added during the deposition of the magnetic body (film) as the reference layer of the magnetoresistive effect element. However, B may be added to a rare earth metal-transition metal magnetic layer after the rare earth metal-transition metal magnetic layer as the reference layer is deposited.

A manufacturing method in which B is added to a rare earth metal-transition metal magnetic layer after the rare earth metal-transition metal magnetic layer for forming an MTJ element is deposited, and the structure of the MTJ element formed thereby are described below.

(1) Configuration Example 1

The structure and manufacturing method of a magnetoresistive effect element (MTJ element) according to Configuration example 1 of the third embodiment are described with reference to FIG. 18 to FIG. 21.

Figure 18:
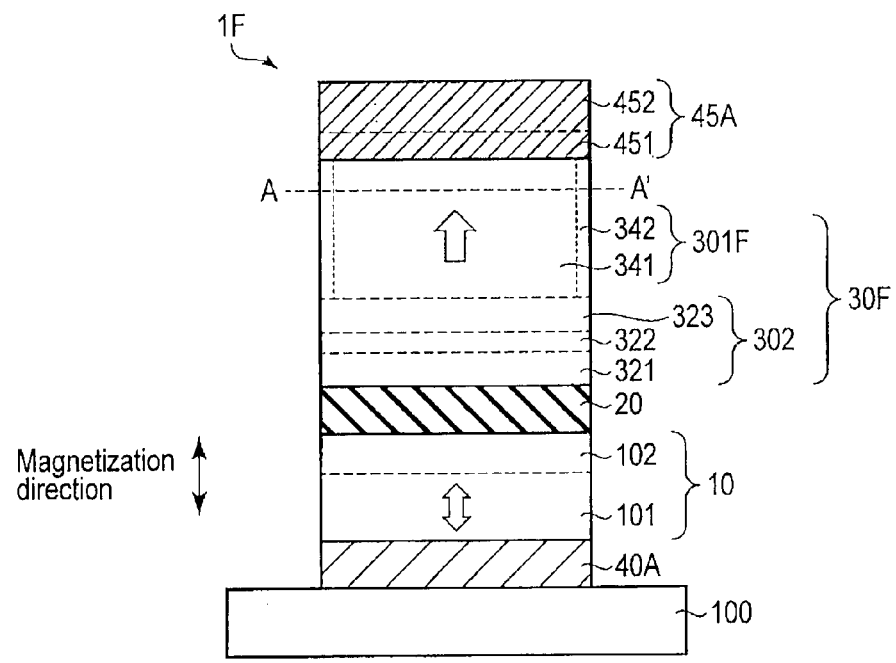
FIG. 18 is a sectional view showing a structural example of a magnetoresistive effect element according to a third embodiment.
Figure 19:
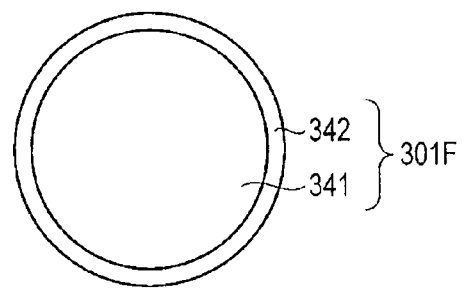
FIG. 19 is a plan view showing a structural example of the magnetoresistive effect element according to the third embodiment.

FIG. 18 shows the sectional structure of an MTJ element 1F according to Configuration example 1 of the third embodiment. FIG. 19 shows a planar structure in section along the A-A' line of FIG. 18 when viewed in a film stacking direction.

In the MTJ element 1F shown in FIG. 18 and FIG. 19, a perpendicular magnetization film 301F in a reference layer 30F is formed by using, for example, an artificial lattice that includes a TbCoFeB layer.

In the MTJ element 1F according to Configuration example 1, the outer peripheral portion of the perpendicular magnetization film 301F is a B-added rare earth metal-transition metal magnetic layer (e.g., TbCoFeB layer) 342. A region 341 inside the TbCoFeB layer 342 in the perpendicular magnetization film 301F is a rare earth metal-transition metal magnetic layer (e.g., TbCoFe layer) 341 that contains little B.

That is, as shown in FIG. 18 and FIG. 19, the TbCoFeB layer 342 is provided on the side surface of the TbCoFe artificial lattice 341 in the reference layer (perpendicular magnetization film 301F) of the MTJ element according to Configuration example 1. The TbCoFeB layer 342 surrounds the side surface of the TbCoFe artificial lattice 341.

The TbCoFe artificial lattice 341 has a structure in which 15 periods of $Tb_{70}Co_{30}$ films having a thickness of 0.5 nm and Fe films having a thickness of 0.3 nm are stacked.

The TbCoFeB layer 342 may be an artificial lattice based on the periodic structure of the TbCoFe artificial lattice 341 (e.g., TbCoB/FeB stack structure), or may be an alloy layer.

In the concentration profile of boron (B) in the perpendicular magnetization film 301F including the TbCoFe layer, the concentration of B in the front side (exposed side or processed side) 342 of the B-added TbCoFe layer 301F is higher than the concentration of B in the internal portion (central portion) 341 of the TbCoFeB layer 342. The TbCoFe artificial lattice 341 includes little B, or the concentration of B in the TbCoFe artificial lattice 341 is lower than the concentration of B in the TbCoFeB layer 342 on the side surface of the TbCoFe artificial lattice 341.

That is, the perpendicular magnetization film 301F including boron (B) and the TbCoFe layer varies in the concentration profile of B in a direction parallel (level) with the film plane, and the highest concentration of B is on the outer peripheral side of the magnetic layer. For example, the concentration of B in the perpendicular magnetization film 301F gradually decreases from the outer peripheral portion to the central portion in the direction parallel with the film plane of the magnetic layer (for example, in a radial direction in the MTJ element having a circular planar shape).

Figure 20:
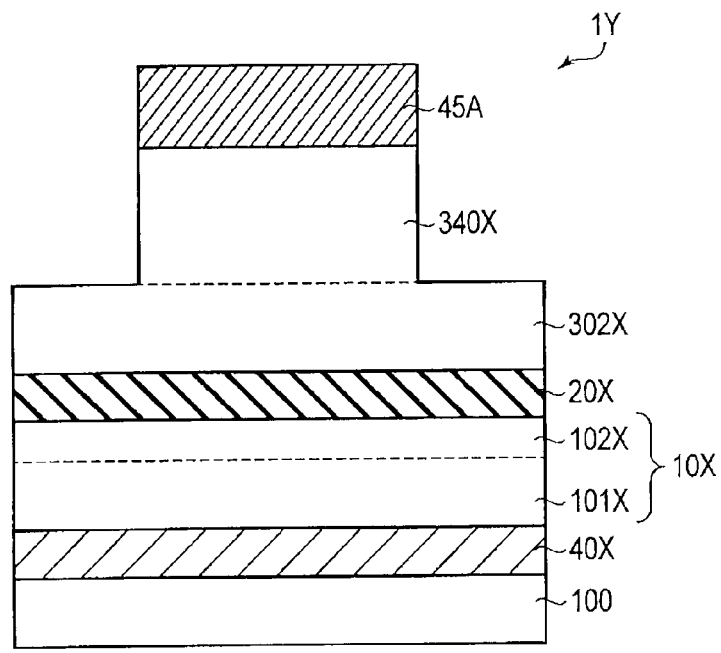
FIG. 20 and FIG. 21 are sectional process views showing an example of a method of manufacturing the magnetoresistive effect element according to the third embodiment.
Figure 21:
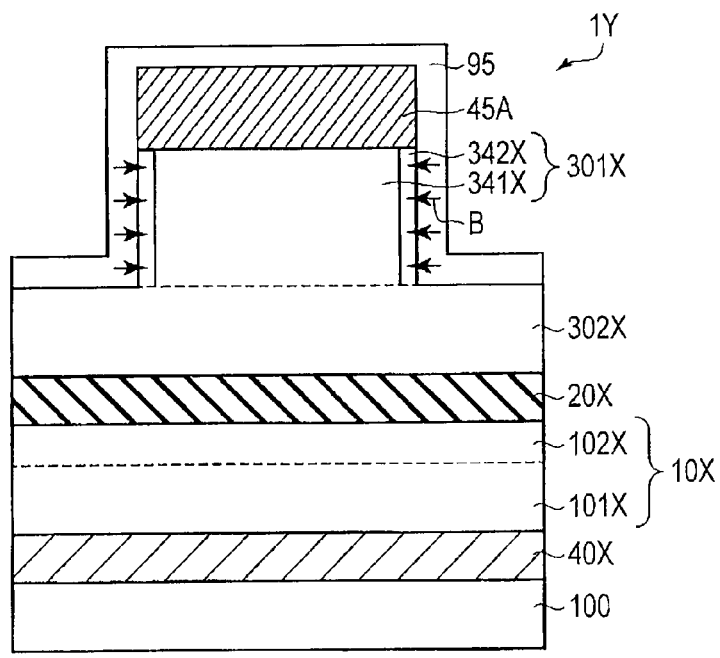

A method of manufacturing the MTJ element according to Configuration example 1 of the present embodiment is described with reference to FIG. 20 and FIG. 21. FIG. 20 and FIG. 21 are sectional process views illustrating the method of manufacturing the MTJ element 1F according to Configuration example 1 of the present embodiment.

As shown in FIG. 20, as the perpendicular magnetization film of the reference layer, 15 periods of $Tb_{70}Co_{30}$ films having a thickness of 0.5 nm and Fe films having a thickness of 0.3 nm are alternately stacked on a magnetic layer 302X as an interfacial layer. As a result, a TbCoFe artificial lattice 340X having 15 periods is formed.

A resist mask (not shown) having a pattern corresponding to the element shape is formed on a hard mask which is formed on the TbCoFe artificial lattice 340X. In the manufacturing method according to Configuration example 1, the hard mask 45A and the perpendicular magnetization film (TbCoFe artificial lattice) 340X are etched, for example, by ion milling in accordance with the resist mask. In this case, the interfacial layer 302X, a nonmagnetic layer (tunnel barrier layer) 20X, and a magnetic layer (film) 10X for forming a storage layer under the TbCoFe artificial lattice are not etched. Therefore, a stack structure 1Y in which the perpendicular magnetization film (TbCoFe artificial lattice) of the reference layer is selectively processed has an upwardly projecting sectional shape.

As shown in FIG. 21, before the stack structure 1Y is exposed to the air, the stack structure 1Y is moved in a vacuum (or in an inert gas atmosphere) from an etching chamber to a film formation chamber, and, for example, a boron film 95 having a thickness of about 2 nm is formed on the TbCoFe artificial lattice as the perpendicular magnetization film. The boron film 95 may contact the upper surface of the magnetic layer 302X as the interfacial layer. The TbCoFe artificial lattice may intervene between the upper surface of the magnetic layer 302X and the boron film 95. Instead of the boron film 95, a boron compound film may be deposited on the TbCoFe artificial lattice 340X. In order for boron to efficiently diffuse in the TbCoFe layer, it is preferable that the concentration (composition ratio, content) of boron in the boron compound film is more than 50 at. %. The thickness of the boron film 95 is preferably 2 nm or less when the removal of the boron film is taken into consideration.

The stack structure 1Y is carried to an anneal chamber so that the TbCoFe artificial lattice 340X is covered with the boron film 95, and the stack structure 1Y is annealed at about 250° C. to 300° C. for 30 minutes.

As a result of the annealing, a B component in the boron film 95 thermally diffuses in the vicinity of the surface (processed surface, exposed surface) of TbCoFe artificial lattice 341X. Accordingly, a B-containing TbCoFe layer (TbCoFeB layer) 342X is formed on the exposed surface of the TbCoFe artificial lattice 341X. The TbCoFeB layer 342X formed by the diffusion of B may maintain an artificial lattice or may be an alloy layer.

In this case, in the concentration profile of B in the perpendicular magnetization film 301X, the concentration of B in the front side (TbCoFeB layer 342X) of the perpendicular magnetization film 301X is higher than the concentration of B in the internal portion (TbCoFe artificial layer 341X) of the perpendicular magnetization film 301X.

After annealing, the stack structure 1Y in which the TbCoFeB layer 342X is formed in the vicinity of the surface of the TbCoFe artificial lattice 341X is moved to the etching chamber. The boron film 95 is removed, and then the processed hard mask and reference layer are used as a mask to sequentially etch the interfacial layer 302X, the tunnel barrier layer 20X, the storage layer 10X, and a foundation layer 40X.

Consequently, the MTJ element according to Configuration example 1 shown in FIG. 18 and FIG. 19 is formed.

In Configuration example 1, boron (B) in the TbCoFeB layer 342 on the side surface of the TbCoFe artificial lattice 341 preferentially diffuses in the vicinity of the surface of the perpendicular magnetization film 301F (340X, 341X) and in a morphological grain boundary.

Therefore, when the processed stack structure is exposed to the air, B precedes other elements (e.g., Tb) in the magnetic layer 301E in combining with oxygen in the vicinity of the surface of the perpendicular magnetization film 301F (340X, 341X). Accordingly, the generation of a rare earth oxide (here, Tb oxide) is reduced in the perpendicular magnetization film 341X including a B-added rare earth metal-transition metal magnetic layer. Moreover, the grain boundary diffusion of oxygen to the perpendicular magnetization film 301F (340X, 341X) is reduced by the segregation of B in the grain boundary as described above.

When the MTJ element according to Configuration example 1 is processed into an element shape, the reduction of Hc in the MTJ element including the TbCoFeB layer is inhibited, and the B-added Tb-based magnetic layer is improved in oxidation resistance. While a Tb-based magnetic layer to which B is not added has a coercive force Hc of about 4 kOe, the B-added Tb-based magnetic layer has a coercive force Hc of 8 kOe. Thus, the coercive force Hc of the Tb-based magnetic layer is almost doubled, depending on whether B is added thereto.

In the present embodiment, in the magnetic layer included in the MTJ element, a layer containing high-concentration boron is selectively formed in a region which tends to be adversely affected by oxygen when exposed to an atmosphere containing oxygen. Thus, the layer containing high-concentration boron is intensively formed exclusively in a local region of the magnetic layer in the vicinity of the outer peripheral portion of the magnetic layer. This can reduce the possible deterioration of the magnetic characteristics (e.g., coercive force) of the magnetic layer caused by the addition of boron and the element characteristics (e.g., MR ratio). As a result, an MTJ element with improved characteristics can be formed.

In the manufacturing method described above, boron is diffused in the TbCoFe layer (TbCoFe artificial lattice) by thermal diffusion. Boron can be added to the TbCoFe layer by ion beam irradiation.

For example, in the process shown in FIG. 21, the interfacial layer 302X, the nonmagnetic layer 20X, the storage layer 10X, and the foundation layer 40X under the TbCoFe layer having the boron film formed on its side surface are not annealed but are processed (etched) by an ion beam using Kr after the ion irradiation angle is set at an angle 45° tilted relative to the direction perpendicular to the substrate surface.

Thus, the B element in the boron film 95 is moved into the TbCoFeB layer (TbCoFe layer) 341X by the ion beam together with the formation (patterning) of the tunnel barrier layer and the storage layer. As a result, a TbCoFeB layer 342X is formed on the processed surface of the TbCoFeB layer 341X.

B may be added to the TbCoFe layer by using both annealing and ion beam irradiation. Otherwise, B may be added to the TbCoFe layer by ion implantation. The ion irradiation angle is not limited to the above-mentioned value. An ion beam other than Kr may be used.

As described above, the MTJ element 1F according to Configuration example 1 of the third embodiment allows the inhibition of its characteristic deterioration as the MTJ elements in the embodiments described above.

(2) Configuration Example 2

The structure and manufacturing method of a magnetoresistive effect element (MTJ element) according to Configuration example 2 of the third embodiment are described with reference to FIG. 22 to FIG. 24.

In Configuration example 1 of the third embodiment, boron (B) is diffused into the perpendicular magnetization film of the rare earth metal-transition metal magnetic film (body) from the outside of this perpendicular magnetization film. On the other hand, in Configuration example 2, B is separated out from within the perpendicular magnetization film (magnetic layer) to the processed surface (exposed surface) of a perpendicular magnetization film.

Figure 22:
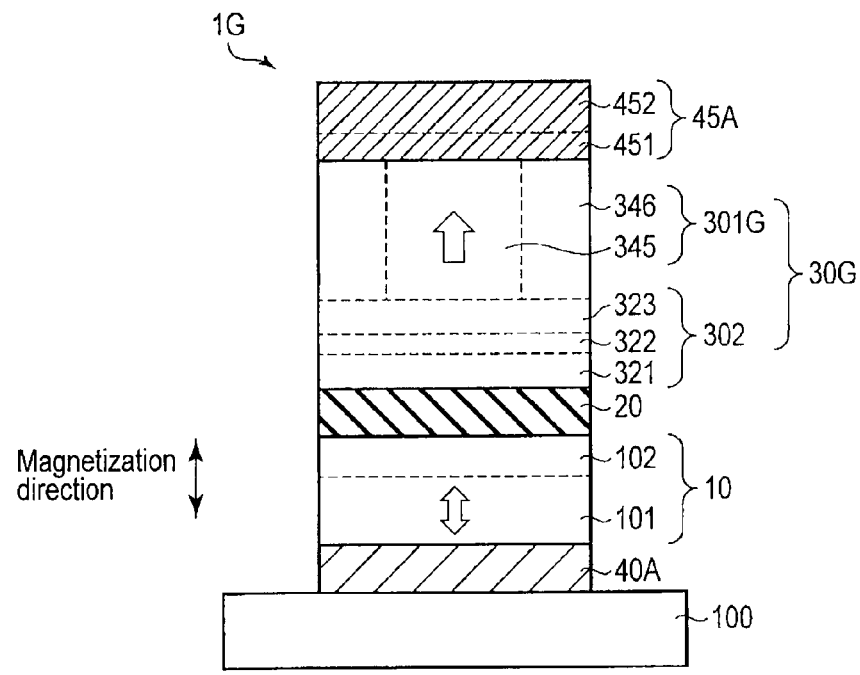
FIG. 22 is a sectional view showing a structural example of the magnetoresistive effect element according to the third embodiment.

FIG. 22 shows the sectional structure of an MTJ element 1G according to Configuration example 2 of the third embodiment.

In the MTJ element 1G according to Configuration example 2 shown in FIG. 22, a perpendicular magnetization film 301G of a reference layer 30G is a TbCoFeB artificial lattice 301G.

The TbCoFeB artificial lattice 301G is formed by using a structure in which 15 periods of $Tb_{70}Co_{30}$ films having a thickness of 0.5 nm and $Fe_{80}B_{20}$ films having a thickness of 0.3 nm are stacked, for example, during the deposition of the film.

The TbCoFeB artificial lattice 301G includes regions 345 and 346 different in the concentration of B in a direction parallel with the substrate surface (in a direction parallel with the film plane). The concentration of B in the region 346 in the outer peripheral portion (exposed surface, processed surface) of the TbCoFeB artificial lattice 301G is higher than the concentration of B in the region 345 in the internal portion (central portion) of the TbCoFeB artificial lattice 301G. The TbCoFeB artificial lattice 301G has a concentration profile that changes in the concentration of B in the direction parallel with the film plane.

In the example shown in FIG. 22, the two regions 345 and 346 different in the concentration of B are provided in the TbCoFeB artificial lattice 301G. This schematically shows the region 346 having high B concentration and the region 345 having low B concentration. The concentration profile (concentration distribution) of B in the TbCoFeB artificial lattice 301G may change step by step (gradually) or change sharply from the internal portion (central portion) of the TbCoFeB artificial lattice to the outer peripheral portion (exposed surface, processed surface) depending on a manufacturing method described later.

In addition to the concentration change in the direction parallel with the film plane, the TbCoFeB artificial lattice 301G may include regions different in the concentration of B in the direction perpendicular to the substrate surface (film stacking direction).

The method of manufacturing the MTJ element according to Configuration example 2 of the present embodiment is described with reference to FIG. 23 and FIG. 24. FIG. 23 is a sectional process view illustrating the method of manufacturing the MTJ element 1G according to Configuration example 2 of the present embodiment. FIG. 24 shows a sectional view of a TbCoFeB layer in the direction parallel with the substrate surface corresponding to the manufacturing process in FIG. 23.

Figure 23:
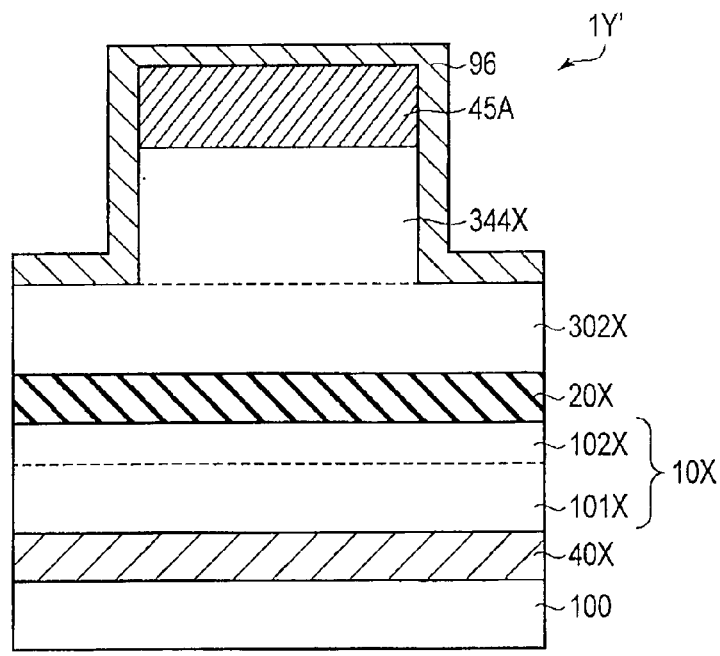
FIG. 23 is a sectional process view showing an example of the method of manufacturing the magnetoresistive effect element according to the third embodiment.
Figure 24:
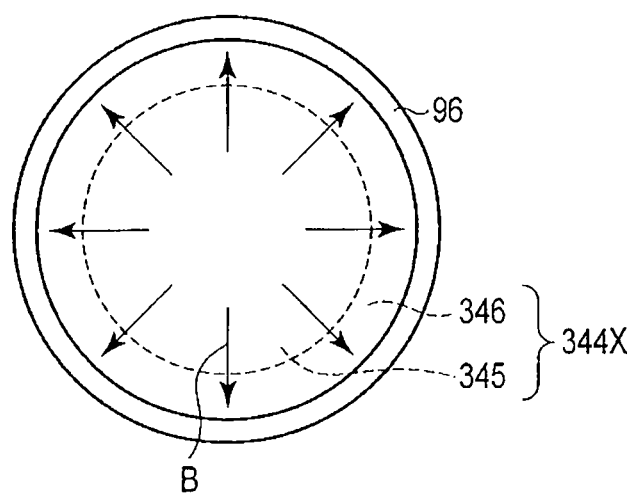
FIG. 24 is a view illustrating an example of the method of manufacturing the magnetoresistive effect element according to the third embodiment.

As shown in FIG. 23, a perpendicular magnetization film 344X including a B-added TbCoFe layer is formed on an interfacial layer 302X. For example, in the perpendicular magnetization film 344X, 15 periods of $Tb_{70}Co_{30}$ films having a thickness of 0.5 nm and $Fe_{80}B_{20}$ films having a thickness of 0.3 nm are stacked. Thus, the perpendicular magnetization film 344X is formed as an artificial lattice.

As in the process shown in FIG. 20, a hard mask 45A and the TbCoFeB artificial lattice 344X are etched. A stack structure in which the side surface of the TbCoFeB artificial lattice 344X is exposed is formed.

A Ta film 96 having a thickness of 2 nm is then formed on the TbCoFeB artificial lattice 344X, for example, by the sputtering method to cover the exposed surface of the TbCoFeB artificial lattice 344X. Instead of the Ta film 96, a Ta compound film may be used if the concentration (composition ratio, content) of Ta in this film is more than 50 at. %. The thickness of the Ta film 96 is preferably 2 nm or less.

Furthermore, as in the process shown in FIG. 21, a processed stack structure 1Y' is moved to the anneal chamber, and the stack structure 1Y' including the TbCoFeB artificial lattice 344X that contacts the Ta film 96 is annealed at about 250° C. to 300° C. for 30 minutes.

B in the TbCoFeB artificial lattice 344X more easily diffuses than other constituent elements (e.g., Tb) in the artificial lattice 344X, and B also easily reacts (combines) with Ta. Therefore, as shown in FIG. 24, boron (B) in the TbCoFeB artificial lattice 344X segregates in the vicinity of the interface between the TbCoFeB artificial lattice 344X and the Ta film 96 as a result of annealing which is conducted while the Ta film 96 is in contact with the B-added TbCoFeB layer 344X.

Thus, in the TbCoFeB artificial lattice 344X, the region (high B concentration region) 346 having high B concentration is formed on the outer peripheral side (Ta film 96 side) of the TbCoFeB artificial lattice 344X, and the region (low B concentration region) 345 lower in B concentration than the region 346 is formed on the inner side (central side) of the TbCoFeB artificial lattice 344X.

The interfacial layer 302X, a tunnel barrier layer 20X, the storage layer 10X, and a lower electrode 40X are sequentially processed by ion milling.

Most of the Ta film 96 deposited on the side surface of the TbCoFeB artificial lattice 344X is removed by etching for the formation of the components under the TbCoFeB artificial lattice 344X. The Ta film 96 on the side surface of the TbCoFeB artificial lattice 344X which has not been removed by the etching is sufficiently oxidized and loses conductivity during the deposition of an interlayer insulating film or during the release of the chamber to the air. Therefore, no short circuit is caused between the reference layer and the storage layer of the MTJ element across the tunnel barrier layer by the Ta film 96 on the side surface of the TbCoFeB artificial lattice 344X.

The MTJ element according to Configuration example 2 shown in FIG. 22 is formed by the process described above.

In the third embodiment, the reference layer including the TbCoFeB layer in the MTJ element according to Configuration example 2 has a coercive force Hc of about 8 kOe when processed into an element shape, substantially the same as the MTJ element according to Configuration example 1.

Accordingly, in the MTJ element 1G according to Configuration example 2, the corrosion resistance is improved by boron added to the rare earth metal-transition metal magnetic layer, and the reduction of the magnetic characteristics (e.g., coercive force) of the rare earth metal-transition metal magnetic layer can be inhibited.

If the film has a concentration (composition ratio, content) of Ta that is more than 50 at. %, B in the TbCoFeB artificial lattice 344X can be relatively easily drawn to the side of the Ta film (processed surface, contact surface). Therefore, instead of the Ta film 96, a Ta compound film may be used. The thickness of the Ta film 96 is preferably 2 nm or less when the removal of the Ta film and the transformation of the Ta film into an insulator are taken into consideration.

The film 96 formed on the side surface of the TbCoFeB layer 344X for the segregation of B is not limited to the Ta film. For example, at least one of the films selected from the group including of a W film, an Hf film, a Zr film, an Nb film, an Mo film, a V film, and a Cr film may be used. For example, an Si film or a Ge film is preferably used instead of the Ta film if a sidewall insulating film made of nitride as a protective film that is formed on the side surface of the TbCoFeB layer 301G is taken into consideration. Compound films may also be used for the above-mentioned films (materials).

As described above, the MTJ element 1G according to Configuration example 2 of the third embodiment allows the characteristic deterioration thereof to be inhibited, as in the MTJ elements in the embodiments described above.

[Applications]

Applications of the magnetoresistive effect elements (MTJ elements) according to the first to third embodiments are described with reference to FIG. 25 to FIG. 30.

(1) Application 1

The magnetoresistive effect elements according to the embodiments described above are used as, for example, memory elements of a magnetic memory such as a magnetoresistive random access memory (MRAM). A spin transfer switching MRAM (or spin-torque transfer MRAM) is shown by way of example as the MRAM according to the present application.

(a) Configuration

FIG. 25 is a diagram showing the circuit configuration of a memory cell array of the MRAM and its vicinity.

As shown in FIG. 25, a memory cell array 9 includes memory cells MC.

The memory cells MC are arrayed in the memory cell array 9. In the memory cell array 9, bit lines BL and bBL and word lines WL are provided. The bit lines BL and bBL extend in a column direction, and the word lines WL extend in a row direction. Two bit lines BL and bin form a pair of bit lines.

The memory cells MC are connected to the bit lines BL and bBL and the word lines WL.

The memory cells MC arranged in the column direction are connected to the same pair of bit lines BL and bBL. The memory cells MC arranged in the row direction are connected to the same word line WL.

The memory cell MC includes, for example, one magnetoresistive effect element (MTJ element) 1 and one selecting switch 2. The MTJ element described in the first to third embodiments is used for the MTJ element 1 in the memory cell MC. Although the MTJ element according to the first embodiment is used in the MRAM in the case described below, it should be understood that the MTJ elements according to the second and third embodiments may be used instead.

The selecting switch 2 is, for example, a field effect transistor. The field effect transistor as the selecting switch 2 is hereinafter referred to as a select transistor.

One end of the MTJ element 1 is connected to the bit line BL, and the other end of the MTJ element 1 is connected to one end (source/drain) of the current path of the select transistor 2. The other end (drain/source) of the current path of the select transistor 2 is connected to the bit line bBL. The control terminal (gate) of the select transistor 2 is connected to the word line WL.

One end of the word line WL is connected to a row control circuit 4. The row control circuit 4 controls the activation/deactivation of the word lines in accordance with external address signals.

Column control circuits 3A and 3B are connected to the bit lines BL and bBL on one end and the other. The column control circuits 3A and 3B control the activation/deactivation of the bit lines in accordance with external address signals.

The writing circuits 5A and 5B are connected to the bit lines BL and bBL on one end and the other via the column control circuits 3A and 3B. The writing circuits 5A and 5B have source circuits and sink circuits. The source circuit includes a current source or a voltage source for generating a write current, and outputs a write current (magnetization switching current) Iw. The sink circuit absorbs the write current Iw.

In the spin transfer switching MRAM, the writing circuits 5A and 5B supply the write current Iw to an externally selected memory cell (hereinafter, a selected cell) during data writing. The writing circuits 5A and 5B pass the write current Iw through the MTJ element in the memory cell MC in two directions depending on data to be written into the selected cell. That is, depending on data to be written, the write current Iw running from the bit line BL to the bit line bBL or the write current Iw running from the bit line bBL to the bit line BL is output from the writing circuits 5A and 5B.

Reading circuits 6A and 6B are connected to the bit lines BL and bBL on one end and the other via the column control circuits 3A and 3B. Each of the reading circuits 6A and 6B includes a voltage source or a current source for generating a read current, a sense amplifier for detecting and amplifying the read current, and a latch circuit for temporarily holding data. The reading circuits 6A and 6B supply the read current to the selected cell during data reading. The value of the read current is lower than the value of the write current Iw (switching threshold) so that the magnetization of the storage layer is not switched by the read current.

The current value or potential at a reading node varies depending the level of the resistance value of the MTJ element 1 to which the read current is supplied. The data to be stored in the MTJ element 1 is determined by the variation dependent on the level of the resistance value.

Although the reading circuits 6A and 6B are provided on both sides in the column direction in the example shown in FIG. 25, one reading circuit alone may be provided on one end in the column direction.

FIG. 26 is a sectional view showing an example of the structure of the memory cell MC provided in the memory cell array 9.

The memory cell MC is formed in an active area AA of a semiconductor substrate 70. The active area AA is marked off by an insulating film 71 buried in an element isolation area of the semiconductor substrate 70.

The upper end of the MTJ element 1 is connected to a bit line 76 (BL) via an upper electrode 45. The lower end of the MTJ element 1 is connected to a source/drain diffusion layer 64 of the select transistor 2 via a lower electrode (foundation layer) 40 and a contact plug 72B. A source/drain diffusion layer 63 of the select transistor 2 is connected to a bit line 75 (bBL) via a contact plug 72A.

A gate electrode 62 is formed on the surface of the active area AA between the two source/drain diffusion layers 63 and 64 via a gate insulating film 61. The gate electrode 62 extends in the row direction, and is used as the word line WL.

Although the MTJ element 1 is provided immediately above the plug 72B, the MTJ element 1 may be located off the position immediately above the contact plug (e.g., above the gate electrode of the select transistor) by using an intermediate interconnect.

In the example shown in FIG. 26, one memory cell is provided in the active area AA. However, two memory cells adjacent in the column direction may be provided in one active area AA so that the two memory cells share plugs connected to one bit line bBL and a source/drain diffusion layer 23. This reduces the size of the memory cell MC.

Although the select transistor 2 shown in FIG. 26 is a field effect transistor having a planar structure, the structure of the field effect transistor is not limited thereto. For example, a field effect transistor having a three-dimensional structure such as a recess channel array transistor (RCAT) or a FinFET may be used as the select transistor. The RCAT has a structure in which a gate electrode is buried in a recess within a semiconductor area via a gate insulating film. The FinFET has a structure in which a gate electrode makes a two-level crossing relative to a rectangular semiconductor area (fin) via a gate insulating film.

As described above, the magnetoresistive effect element (MTJ element) 1 according to each of the embodiments and each of the configuration examples is improved in corrosion resistance (oxidation resistance) and heat resistance by the addition of boron (B) to the magnetic layer that includes rare earth. Thus, the characteristic deterioration of the MTJ element can be inhibited. This enables stable operation (e.g., data writing) even after a process including oxygen or a high-temperature process.

Consequently, the operational reliability of the MRAM that uses the MTJ element according to the embodiments can be improved.

(B) Manufacturing Method

A method of manufacturing the memory cell in the MRAM according to the present application is described with reference to FIG. 26 to FIG. 28.

Figure 27:
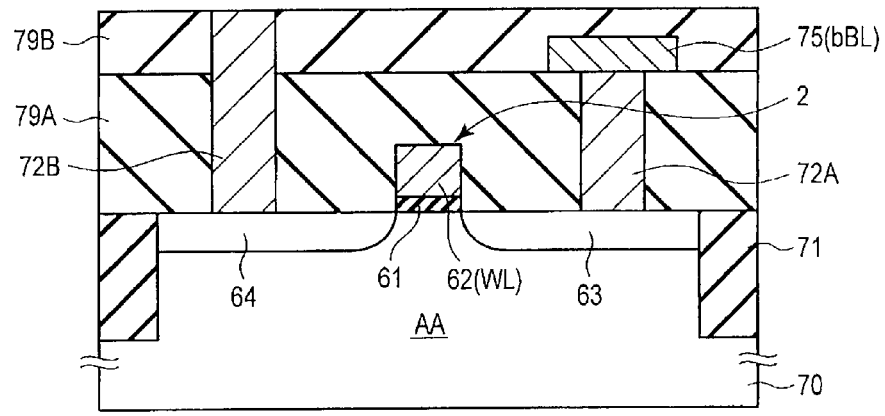
Figure 28:
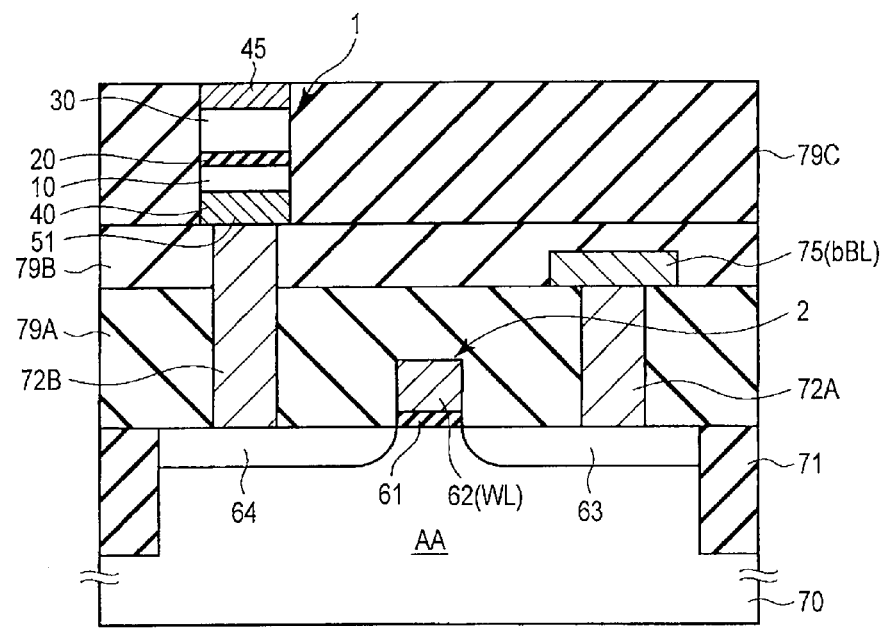

FIG. 27 and FIG. 28 respectively show sections of the memory cell MC along the column direction in the manufacturing steps of the MRAM.

As shown in FIG. 27, for example, an element isolation insulating film 71 having a shallow trench isolation (STI) structure is buried in a semiconductor substrate 70, thereby forming an element isolation area. An active area AA is marked off in the semiconductor substrate 70 by the formation of the element isolation area.

A select transistor 2 of the memory cell MC is then formed on the active area AA of the semiconductor substrate 70. The process of forming the select transistor is as follows.

A gate insulating film 61 is formed on the active area AA. The gate insulating film 61 is a silicon oxide film formed, for example, by a thermal oxidation method. A conductive layer (e.g., polysilicon film) is then formed on the gate insulating film 61, for example, by the chemical vapor deposition (CVD) method.

The conductive layer is processed into a predetermined pattern, for example, by photolithography and the RIE method. As a result, a gate electrode 62 is formed on the gate insulating film 61. In order to use the gate electrode 62 as a word line, the gate electrode 62 is formed to extend in the row direction. Therefore, the gate electrode 62 is shared by the select transistors arranged along the row direction.

Source/drain diffusion layers 63 and 64 are formed in the semiconductor substrate 70. The diffusion layers 63 and 64 are formed by using the gate electrode 62 as a mask to implant an impurity such as arsenic (As) or phosphorus (P) into the semiconductor substrate 70 by an ion implantation method.

The select transistor 2 is formed on the semiconductor substrate 70 by the process described above. The formation of a silicide layer on the upper surfaces of the gate electrode 62 and the diffusion layers 63 and 64 may be further added.

A first interlayer insulating film 79A is then deposited on the semiconductor substrate 70, for example, by the CVD method to cover the select transistor 2. The upper surface of the interlayer insulating film 79A is planarized by the chemical mechanical polishing (CMP) method.

A contact hole is formed in the interlayer insulating film 79A so that the upper surface of the source/drain diffusion layer 63 is exposed. The formed contact hole is filled with, for example, tungsten (W) or molybdenum (Mo), thereby forming a contact plug 72A.

A metal film is deposited on the interlayer insulating film 79A and the contact plug 72A. The deposited metal film is processed into a predetermined shape by photolithography and the RIE method. As a result, a bit line 75 (bBL) connected to the current path of the select transistor 2 is formed.

A second interlayer insulating film 79B is then deposited on the interlayer insulating film 79A and the bit line 75, for example, by the CVD method. A contact hole is formed in the interlayer insulating films 79A and 79B so that the surface of the source/drain diffusion layer 64 is exposed. A contact plug 72B is buried in the contact hole by, for example, the sputtering method or the CVD method.

Components of a magnetoresistive effect element (MTJ element) 1 are sequentially deposited on the interlayer insulating film 79B and the contact plug 72B by one or a proper combination of the methods according to the embodiments described above. The interlayer insulating film 79B and the contact plug 72B are used as substrates for forming the MTJ element 1. The formed MTJ element 1 includes a boron-added rare earth metal-transition metal magnetic layer (TbCoFeB alloy or TbCoFeB artificial lattice) on at least one of a reference layer and a storage layer.

As shown in FIG. 28, after the MTJ element 1 is formed, a sidewall insulating film (e.g., SiN) is formed, for example, by the ALD method, and an interlayer insulating film (e.g., $SiO_2$) 79C is formed, for example, by the CVD method.

As described above, oxygen derived from the interlayer insulating film 79C may pass through the sidewall insulating film and permeate the TbCoFeB layer during the deposition of the interlayer insulating film 79C made of an oxide. The rare earth metal-transition metal magnetic layer 40 including the TbCoFe layer is doped with boron (B) in the same manner as the magnetic layer of the MTJ element 1 according to the embodiments such that B precedes Tb in oxidizing. Alternatively, B segregates in the grain boundary within the magnetic layer. Therefore, in the TbCoFeB layer 40, the formation of a Tb oxide is inhibited, and the deterioration of the magnetic characteristics (e.g., coercive force) of the TbCoFeB layer 40 caused by the oxidization is inhibited.

The upper surface of an upper electrode 45 is exposed, for example, by the CMP method, and a bit line BL is formed on the interlayer insulating film 79C by a known technique, as shown in FIG. 26.

The memory cell of the MRAM as the application is formed by the process described above.

As has been described with reference to FIG. 25 to FIG. 28, the magnetoresistive effect element (MTJ element) 1 according to the embodiments can be applied to the MRAM. As described above, according to the embodiments, the magnetoresistive effect element (MTJ element) 1 with inhibited element characteristic deterioration can be provided.

Accordingly, the operational characteristics and reliability of the MRAM according to the present application can be improved by using the magnetoresistive effect element according to the embodiments.

(2) Application 2

The magnetoresistive effect element according to each of the embodiments can be applied to a magnetic head (TMR head) of a magnetic disk unit (e.g., HDD).

FIG. 29 is a schematic diagram showing the structure of the HDD. FIG. 30 is a schematic diagram showing a magnetic head assembly equipped with the TMR head.

As shown in FIG. 29 and FIG. 30, an actuator arm 81 has a hole to be fixed to a fixing shaft 80 in the unit, and a suspension 82 is connected to one end of the actuator arm 81. A head slider 83 equipped with the TMR head is attached to the tip of the suspension 82. A lead wire 84 for data writing and reading is formed in the suspension 82. One end of the lead wire 84 is electrically connected to an electrode of the TMR head in the head slider 83. The TMR head includes the MTJ element 1 according to the embodiments. The other end of the lead wire 84 is connected to an electrode pad 45.

A magnetic disk 86 is attached to a spindle 87, and is driven by a motor in accordance with a control signal from a drive controller. The head slider 83 is lifted by a predetermined amount by the rotation of the magnetic disk 86. In this condition, data is recorded/reproduced by using the TMR head including the MTJ element according to the embodiments.

The actuator arm 81 has a bobbin for holding a driving coil. A voice coil motor 88 which is a kind of linear motor is connected to the actuator arm 81. The voice coil motor 88 has a magnetic circuit. The magnetic circuit has the driving coil wound around the bobbin of the actuator arm 81, and a permanent magnet and a facing yoke that face each other across the driving coil. The actuator arm 81 is held by ball bearings provided at two upper and lower places in the fixing shaft 80. The actuator arm 81 is driven by the voice coil motor 88.

When the magnetoresistive effect element is used in the magnetic head, the performance of the magnetic disk unit can be improved by the use of the magnetoresistive effect element with inhibited characteristic deterioration.

[Modification]

A modification of the magnetoresistive effect element (MTJ element) according to the embodiments is described with reference to FIG. 31 and FIG. 32.

In the examples shown in the embodiments and applications described above, the boron (B)-added rare earth metal-transition metal magnetic layer is used for the reference layer of the MTJ element. However, the B-added rare earth metal-transition metal magnetic layer may be used for the storage layer 10 of the MTJ element. The B-added rare earth metal-transition metal magnetic layer (e.g., TbCoFeB layer) shown in the embodiments described above can be used for the storage layer 10. Even when the storage layer 10 of the MTJ element is the B-added (B-doped or B-containing) rare earth metal-transition metal magnetic layer, the above-mentioned advantageous effects are obtained.

Although the top-pin MTJ element is shown in the examples described above, a bottom-pin MTJ element also provides the above-mentioned advantageous effects.

FIG. 31 shows a sectional structure according to the modification of the magnetoresistive effect element (MTJ element) of the embodiments. For example, as shown in FIG. 31, a bias layer (also referred to as a shift adjustment layer) 42 may be provided in the MTJ element 1 to lessen the magnetic field leaking from the reference layer 30 (magnetostatic stray field, leak magnetic field).

The magnetostatic stray field applied to the storage layer 10 from the reference layer 30 can be reduced to zero by inserting, between the upper electrode 45 and the reference layer 30, the perpendicular magnetization film (bias layer) 42 which has a magnetization direction antiparallel to the magnetization direction of the reference layer 30.

A nonmagnetic layer 41 is provided between the bias layer 42 and the reference layer 30. The bottom surface (first surface) of the reference layer 30 is in contact with a tunnel barrier layer 20, and the upper surface (second surface) of the reference layer 30 is in contact with the nonmagnetic layer 41.

The bias layer 42 includes a perpendicular magnetization film 301'. For example, the magnetization direction of the bias layer 42 is opposite to the magnetization direction of the reference layer.

The same material as that of the reference layer 30 may be used for the bias layer 42. For example, a boron-added rare earth metal-transition metal magnetic layer such as a TbCoFeB layer is used for the bias layer 42.

As the material for the nonmagnetic layer 41 between the reference layer 30 and the bias layer 42, it is preferable to select a material that allows a stable exchange bias to be formed when the magnetization direction of the reference layer 30 is antiparallel to the magnetization direction of the bias layer 42. The material for the nonmagnetic layer 41 is preferably a nonmagnetic metal. For example, the material for the nonmagnetic layer 41 is selected from Ru, silver (Ag), and Cu.

An interfacial layer may be provided between the reference layer 30 and the nonmagnetic layer 41 (e.g., Ru) or between the bias layer 42 and the nonmagnetic layer 41. This can reinforce the antiparallel bond between the reference layer 30 and the bias layer 42. For example, a film made of a substance selected from the group consisting of CoFe, Co, Fe, CoFeB, CoB, and FeB or a stack film made of these substances is used as the interfacial layer in the vicinity of the nonmagnetic layer 41.

A bias layer may be provided in a foundation layer 40A or between a buffer layer in the foundation layer 40A and a lower electrode.

FIG. 32 shows the sectional structure of the MTJ element according to the modification different from that shown in FIG. 31.

As described above, B in the B-doped rare earth metal-transition metal magnetic layer 301 may react with oxygen. Therefore, as shown in FIG. 32, a boron oxide film 39 may be formed on the surface of the B-doped rare earth metal-transition metal magnetic layer (e.g., TbCoFeB layer) 301.

Thus, the boron oxide film 39 is formed on the surface of the TbCoFeB layer 301, so that the formed boron oxide film 39 may serve as a protective film for the TbCoFeB layer 301 to inhibit the oxidization of the Tb component in the TbCoFeB layer 301. This can inhibit the characteristic deterioration of the MTJ element caused by the oxidization of the magnetic layer (e.g., TbCoFe layer) that includes a rare earth metal.

The configuration described above in each of the embodiments can be applied to the MTJ element according to the modification shown in FIG. 31 and FIG. 32.

Advantageous effects similar to those provided by the embodiments and applications described above can be obtained by the magnetoresistive effect element according to the modification shown in FIG. 31 and FIG. 32.

[Addition]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive effect element comprising:
a first magnetic film having a perpendicular magnetic anisotropy and an invariable magnetization direction;
a second magnetic film having a perpendicular magnetic anisotropy and a variable magnetization direction; and
a nonmagnetic film between the first magnetic film and the second magnetic film,
wherein at least one of the first and second magnetic films includes a first magnetic layer, the first magnetic layer includes a rare earth metal, a transition metal, and boron, a concentration of boron in the first magnetic layer is more than 0 at. % and less than 25 at. %, and
a concentration of boron in the first magnetic layer varies in a direction parallel with a layer plane of the first magnetic layer.

2. The magnetoresistive effect element according to claim 1, wherein
in the first magnetic layer, a sum of a concentration of the rare earth metal and a concentration of the transition metal is 75 at. % or more and less than 100 at. %.

3. The magnetoresistive effect element according to claim 1, wherein the rare earth metal includes at least one kind of element selected from the group consisting of Tb, Gd, and Dy, and the transition metal includes at least one kind of element selected from the group consisting of Co and Fe.

4. The magnetoresistive effect element according to claim 1, further comprising:
a second magnetic layer in at least one of the first and second magnetic films including the first magnetic layer, the second magnetic layer including a rare earth metal, a transition metal, and boron;
a first layer between the first and second magnetic layers, the first layer including a nonmagnetic element.

5. The magnetoresistive effect element according to claim 4, wherein a concentration of the nonmagnetic element in the first layer is more than 20 at. %.

6. The magnetoresistive effect element according to claim 4, wherein the nonmagnetic element is at least one element selected from the group consisting of Ta, W, Hf, Zr, Nb, Mo, V, Cr, Si, and Ge.

7. The magnetoresistive effect element according to claim 1, wherein
a first concentration of boron on an outer peripheral side of the first magnetic layer among the concentration of the boron is higher than a second concentration of boron in a center of the first magnetic layer among the concentration of the boron.

8. The magnetoresistive effect element according to claim 1, wherein the first magnetic layer is one of an artificial lattice and an alloy layer.

9. The magnetoresistive effect element according to claim 1, wherein the at least one of the first and second magnetic films including the first magnetic layer further includes an interfacial layer between the first magnetic layer and the nonmagnetic film.

10. A magnetic memory comprising:
a memory cell including the magnetoresistive effect element according to claim 1.

11. A magnetoresistive effect element comprising:
a first magnetic film having a perpendicular magnetic anisotropy and an invariable magnetization direction;
a second magnetic film having a perpendicular magnetic anisotropy and a variable magnetization direction; and
a nonmagnetic film between the first magnetic film and the second magnetic film, wherein
at least one of the first and second magnetic films includes a first magnetic layer,
the first magnetic layer includes a rare earth metal, a transition metal, and boron, and a concentration of boron in the first magnetic layer varies in a direction parallel with a layer plane of the first magnetic layer.

12. The magnetoresistive effect element according to claim 11, wherein
a first concentration of boron on an outer peripheral side of the first magnetic layer among the concentration of boron is higher than a second concentration of boron in a center of the first magnetic layer among the concentration of boron.

13. A magnetic memory comprising:
a memory cell including the magnetoresistive effect element according to claim 11.

* * * * *